United States Patent [19]
Chevallier

[11] Patent Number: 5,793,087
[45] Date of Patent: *Aug. 11, 1998

[54] SEGMENTED NON-VOLATILE MEMORY ARRAY HAVING MULTIPLE SOURCES

[75] Inventor: Christophe J. Chevallier, Palo Alto, Calif.

[73] Assignee: Micron Quantum Devices, Inc., Santa Clara, Calif.

[*] Notice: The term of this patent shall not extend beyond the expiration date of Pat. No. 5,646,429.

[21] Appl. No.: 814,326

[22] Filed: Mar. 11, 1997

Related U.S. Application Data

[63] Continuation of Ser. No. 606,245, Feb. 23, 1996, Pat. No. 5,646,429.

[51] Int. Cl.[6] .................................................. H01L 29/78
[52] U.S. Cl. .......................... 257/390; 257/401; 365/185; 365/218
[58] Field of Search ............................. 257/316, 321, 257/322, 390; 365/185, 218, 401

[56] References Cited

U.S. PATENT DOCUMENTS

| | | | |
|---|---|---|---|
| 5,384,743 | 1/1995 | Rouy | 365/218 |
| 5,418,742 | 5/1995 | Asano | 365/185 |
| 5,535,167 | 7/1996 | Hazani | 365/218 |

FOREIGN PATENT DOCUMENTS 5-128878  5/1993  Japan .................................. 365/218

*Primary Examiner*—Donald Monin
*Attorney, Agent, or Firm*—Schwegman, Lundberg, Woessner & Kluth, P.A.

[57] ABSTRACT

An arrangement of non-volatile memory cells, such as flash memory cells which includes erase blocks which can be separately erased and which require a reduced amount of circuit area. The erase blocks each include an array of the cells arranged in rows and columns. Each cell in a row has its control gate connected to a common word line and its drain connected to a common bit line. All of the sources of one of the erase blocks are connected together by a source line structure which includes non-metallic source lines, such as doped semiconductor lines, which run generally parallel with respect to the word line and interconnect the sources of cell located in a row. The source line structure further includes at least one metallic source line which functions to interconnect the source regions of cells located in one of the erase block cell columns. The metallic source line of one of the erase blocks extends over, but is not connected to, the adjacent erase block, with the source lines of the erase blocks preferably being connected to a common source line decoder used to control the status of a selected one of the source lines so that a selected one of the erase blocks can be erased.

35 Claims, 12 Drawing Sheets

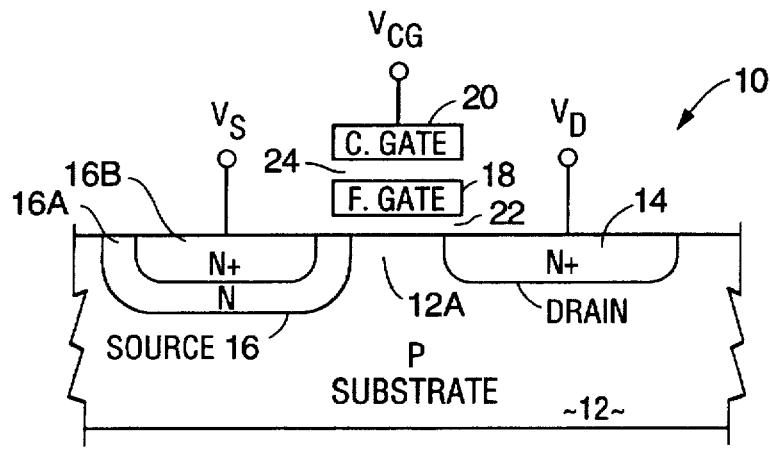
FIG. 1
(PRIOR ART)
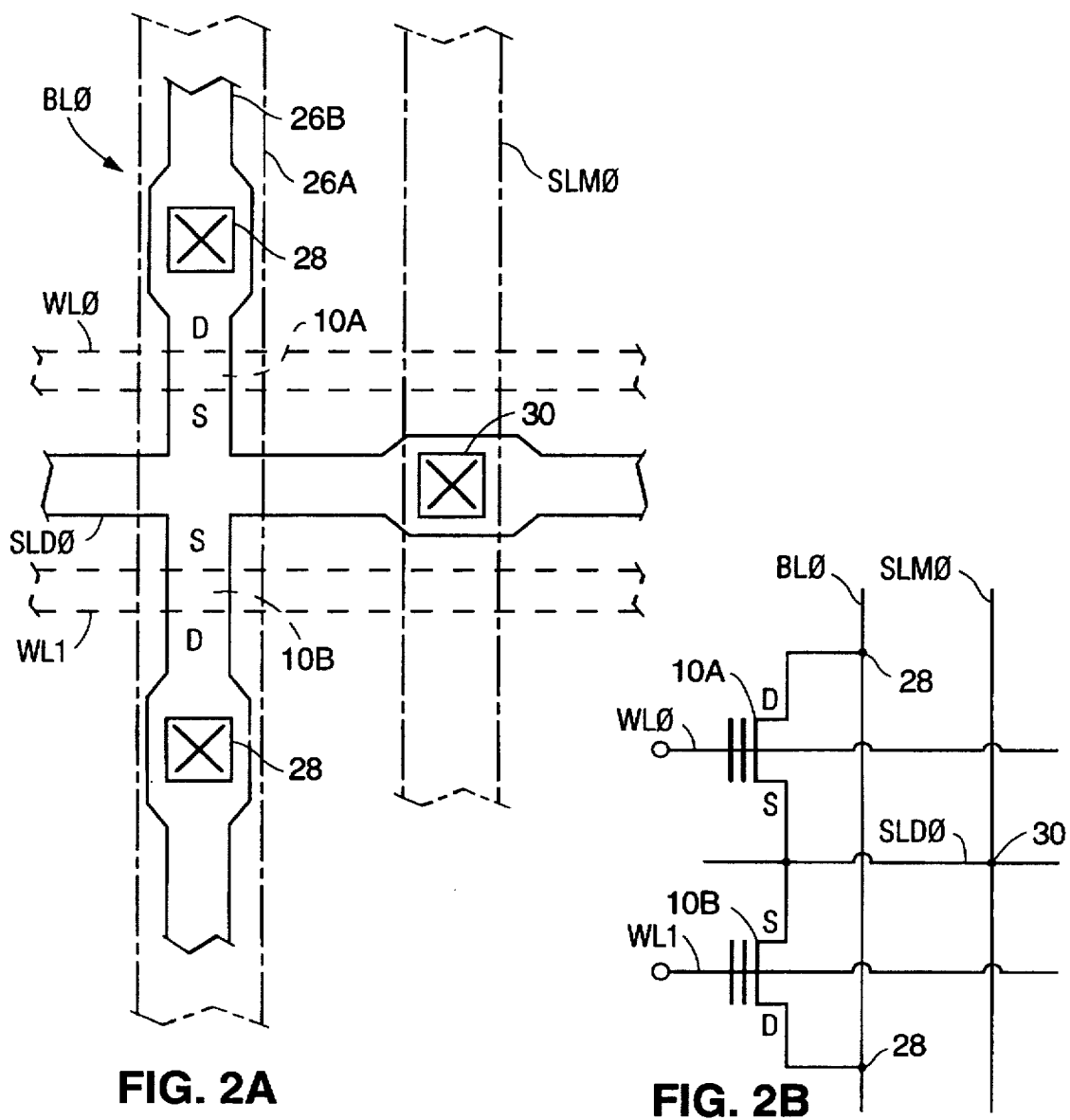
FIG. 2A
(PRIOR ART)
FIG. 2B
(PRIOR ART)

SEGMENTED NON-VOLATILE MEMORY ARRAY HAVING MULTIPLE SOURCES

This is a continuation of application Ser. No. 08/606,245, filed Feb. 23, 1996 now U.S. Pat. No. 5,646,429.

BACKGROUND OF THE INVENTION

The present invention relates generally to semiconductor memory systems and in particular to a segmented non-volatile memory array having multiple sources so that blocks of the array can be erased separately.

BACKGROUND ART

Non-volatile semiconductor memory systems have become increasingly popular, including flash memory systems. FIG. 1 is a simplified diagram of the cross-section of a typical flash memory cell 10. Cell 10 is an N-channel device formed in a P-type substrate 12. An N-type drain region 14 is formed in substrate 12 as is an N-type source region 16. Source region 16 includes an N-type region 16A formed in the substrate 12 having a an N+-type region 16B formed inside region 16A so as to form a graded source region 16.

The drain and regions source 14 and 16 are spaced apart from one another so as to form a channel region 12A in the substrate intermediate the two regions. A floating gate 18 is disposed above the channel region 12A and a control gate 20 is disposed above the floating gate 18. The floating gate is separated from the channel region 12A by a thin (100 Å) gate oxide layer 22. The floating and control gates 18 and 20 are typically both formed from doped poly silicon. The control gate 20 is separated from the floating gate 18 by an interpoly dielectric layer 24. Other than being capacitively coupled to other elements of cell 10, the floating gate 18 is electrically isolated from the rest of the cell. Table 1 below shows typical conditions for performing program, read and erase operations on flash cell 10.

TABLE 1

| OPERATION | SOURCE ($V_S$) | DRAIN ($V_D$) | CONTROL GATE ($V_G$) |
|---|---|---|---|
| READ | ground | +1.5 volts | +5 volts |
| PROGRAM | ground | +6 volts | +12 volts |
| ERASE | +12 volts | float | ground |

If cell 10 is in an erased state, the cell will have a threshold voltage, called an erased threshold voltage, which is typically approximately +2 volts. If the cell is in a programmed state, the cell will have a programmed threshold voltage of typically approximately +6 volts. In a read operation, the control-gate-to-source voltage of the cell is +5 volts as can be seen from Table 1, above. The drain 14 will be connected to a small positive voltage of typically +1.5 volts and the source 16 is grounded. Thus, if the cell 10 is in a programmed state, the cell will not conduct current in the read operation since the gate-to-source voltage of +5 volts is less than the programmed threshold voltage of +6 volts. If the cell is in an erased state, the gate to source voltage will exceed the erased threshold voltage so that the cell will conduct current. The presence or absence of cell current in a read operation is detected by a sense amplifier so that the state of the cell can be determined.

In order to program the flash cell 10, Table 1 indicates that the source 16 is grounded and the drain 14 is connected to +6 volts. The control gate 20 is connected to a high voltage such as +12 volts.

The combination of conditions will cause electrons to travel from the source 16 towards the drain 14. Some of these electrons will possess sufficient energy to pass through the gate oxide 22 towards the positive voltage on the control gate 20. Those electrons, sometimes referred to as hot electrons, will be deposited on the floating gate 18 and will remain there until the cell 10 is erased. The presence of electrons on the floating gate 18 will tend to increase the threshold voltage of the cell, as previously noted.

A cell is erased, as indicated by Table 1, by floating the drain 14 and applying a large positive voltage, such as +12 volts, to the source 16. The control gate 20 is left disconnected (floating). This combination causes electrons stored on the floating gate 18 to pass through the thin gate oxide 22 and to be transferred to the source 16. The physical mechanism for the transfer is commonly referred to as Fowler Nordheim tunneling.

In a flash memory system, the flash cells 10 are arranged in a cell array which typically includes several rows and several columns of cells. Each of the rows has an associated word line connected to the control gate 20 of the cells 10 located in the row. Each of the columns has an associate bit line connected to the drain 14 of each cell located in the column. The sources 16 of all of the cells of the array are usually connected in common, but as will be explained, the sources may be separately connected.

FIG. 2A is a simplified plan view of a conventional layout of a pair of flash cells 10A and 10B of a cell array. FIG. 2B is a schematic diagram of cells 10A and 10B of FIG. 2A. As can be seen in FIG. 2B, cells 10A and 10B have their respective sources connected in common. Typically, the two sources are actually a single source region shared by the two cells 10A and 10B. Cells 10A and 10B are located in a common array column and in separated rows. The column has an associated bit line BL0 which is connected to the drains of cells 10A and 10B. Cell 10A is in a row having an associated word line WL0 connected to its control gate 20 and cell 10B is in an adjacent row having its control gate 20 connected to an associated word line WL1.

The bit lines, including bit line BL0, extend vertically along the array and include an underlying diffusion component 26A of doped semiconductor material and an overlying metal line component 26B. The metal line component 26B makes electrical contact with the diffusion component 26A every two cells 10 by way of contacts 28. The source lines have a horizontal segment SLD0 which runs generally parallel to the word lines and is made of doped semiconductor material. The source lines also have a vertical segment SLM0 which runs generally parallel to the bit lines and is formed from metal. The horizontal and vertical components SLD0 and SLM0 are electrically connected by way of a contact 30 located at the intersection of the two segments every two rows of the array.

Cell 10A has its control gate 20 connected to horizontal word line WL0, a doped polysilicon line which extends across the array. Cell 10B has its control gate 20 connected to horizontal word line WL1 which also extends across the array. A flash cell (10A, 10B) is formed at the intersection of the each of the word lines and bit lines.

FIG. 3A is a simplified plan view of the layout of a relatively small conventional flash cell array 32 and FIG. 3B is a schematic diagram of the FIG. 3A array. Array 32 is comprised of twelve rows, each having an associated horizontal polysilicon word line WL0–WL11. The array also has twelve columns, with each column having an associated metal bit line BL0–BL11. Array 32 also includes four vertical metal source lines SLM0–SLM3 which are connected in common to the six horizontal diffused source lines SLD0–SLD5. Each metal source line SLMN is connected to the diffused source lines SLDN every two rows. The metal source lines SLM are spaced every four columns. For example, adjacent metal source lines SLM0 and SLM1 are separated by four bit lines BL0–BL3.

The metal source lines SLM0–SLM3 are electrically connected together by circuitry (not depicted) external to array 32. Thus, all of the source lines of the array are nominally at the same electrical potential. However, the horizontal diffused source lines SLD0–SLD5 have a relatively high resistance, in comparison to the metal source lines. This high resistance can have an adverse impact upon memory operations, particularly programming and reading operations. The use of multiple metal source lines functions to reduce the overall source line resistance. However, each metal line occupies a significant amount of integrated circuit area so that the use of multiple metal source lines will increase the die area and thereby effectively increase the cost of manufacturing the cell array.

Flash memory systems are typically erased in bulk. That means that either all or a large part of the array are erased at the same time. By way of example, the entire array 32 of FIGS. 3A and 3B would be erased in a single operation. As indicated by Table 1, this can be accomplished by applying +12 volts to the common source lines SLM0–SLM3, grounding all of the word lines WLN0–WLN11 and floating all of the bit lines BL0–BL11.

There exist conventional memory arrays which provide the capability of erasing less than the entire array. This feature is particularly useful in many memory applications where it is desirable to retain some data stored in the memory while erasing and then reprogramming other data in the memory. The capability of erasing less than the entire memory is typically accomplished by electrically isolating the source lines of individual blocks of the memory array. A particular block is erased by applying a high voltage, such as +12 volts (Table 1) to the source line associated with the block being erased. The word lines of the block to be erased are grounded and the bit lines of the block are left floating. As is known, the word lines and source lines of the erase blocks not being erased, the deselected erase blocks, are grounded so that the cells in the deselected erase blocks are not erased.

U.S. Pat. No. 5,126,808 entitle "Flash EEPROM ARRAY WITH PAGED ERASE ARCHITECTURE" discloses a few conventional techniques for providing the capability of erasing less than the entire array. Typically, the array includes segments or blocks having separate associated source lines. For relatively large erase blocks, it is conventional to use more than a single metal source line for each block so as to reduce the source line resistance. However, as previously noted, every additional metal source line will increase the area of the integrated circuit.

In order to reduce the number of source lines exiting an erase block, some conventional arrays utilize decoding circuitry located within the array itself. In that event, the decoding circuitry would be connected to receive various source lines as input and would provide a single output based upon the particular erase block being accessed. One disadvantage of this approach is that decode circuitry usually utilizes conventional transistors which are frequently difficult to implement in the interior of a flash cell array.

The present invention overcomes the above-described limitations of conventional flash cell arrays. The disclosed arrays are divided into separate erase blocks which permits less than the entire array to be erased. In addition, the overall source resistance of the disclosed array can be reduced to a level similar to that of an array which is not divided into separate erase blocks. This latter advantage is particularly applicable for relatively large arrays. Further, these advantages are achieved without greatly increasing the integrated circuit area. These and other advantages of the subject invention will be apparent to those skilled in the art upon a reading of the following Detailed Description of the Invention together with the drawings.

SUMMARY OF THE INVENTION

An arrangement of non-volatile memory cells, such as flash memory cells, is disclosed. The arrangement includes a plurality of erase blocks, with each of the blocks including an array of cells which can be erased separately from the cells of the remaining erase blocks.

The cells of each erase block are arranged into an array of rows and columns of cells. The cells located in one of the rows have their control gates connected to a common word line and the cells located in one of the columns have their drains connected to common bit lines. Preferably, the bit lines are common to all of the erase blocks. The sources of the cells located in one of the erase blocks are connected together by a common source line structure. The source line structure includes non-metallic source lines, typically doped semiconductor lines which are generally parallel with the word lines. The doped semiconductor lines interconnect the sources of cells located in a common row. Typically, the cells are arranged so that cells in a pair of adjacent rows have common source regions so that one of the non-metallic source lines interconnects the sources of a pair of rows.

The source line structure of each of the erase blocks further includes a metallic source line positioned to interconnect the non-metallic source lines. The metallic source line are typically aligned in a parallel relationship with the bit lines of the erase block. Thus, the source regions of the cells in a particular erase block are interconnected by both the metallic and non-metallic source lines, thereby reducing the overall source line resistance while minimizing the area required by the structure.

The plurality of erase blocks each include first and second opposite block edges extending generally parallel with the cell rows. The plurality of erase blocks includes first and second ones of the erase blocks which are positioned relative to one another so that the first block edge of the first erase block is facing the second block edge of the second erase block. The metallic source line of the first erase block extends across the first edge of the first erase block, across the second edge of the second erase block and across the first edge of the first erase block. The metallic source line of the second erase block also extends over the first edge of the second erase block. Preferably, the metallic source lines of the first and second erase blocks are coupled to a common erase source decoder means which functions to control the metal source lines so that the erase blocks may be independently erased.

BRIEF DESCRIPTION OF THE DRAWINGS

FIG. 1 is a simplified cross-sectional view of a conventional flash memory cell.

FIG. 2A is a plan view of the conventional layout of a pair of flash memory cells.

FIG. 2B is a schematic diagram of the conventional pair of flash memory cells of FIG. 2A.

DETAILED DESCRIPTION OF THE INVENTION

Figure 3A:
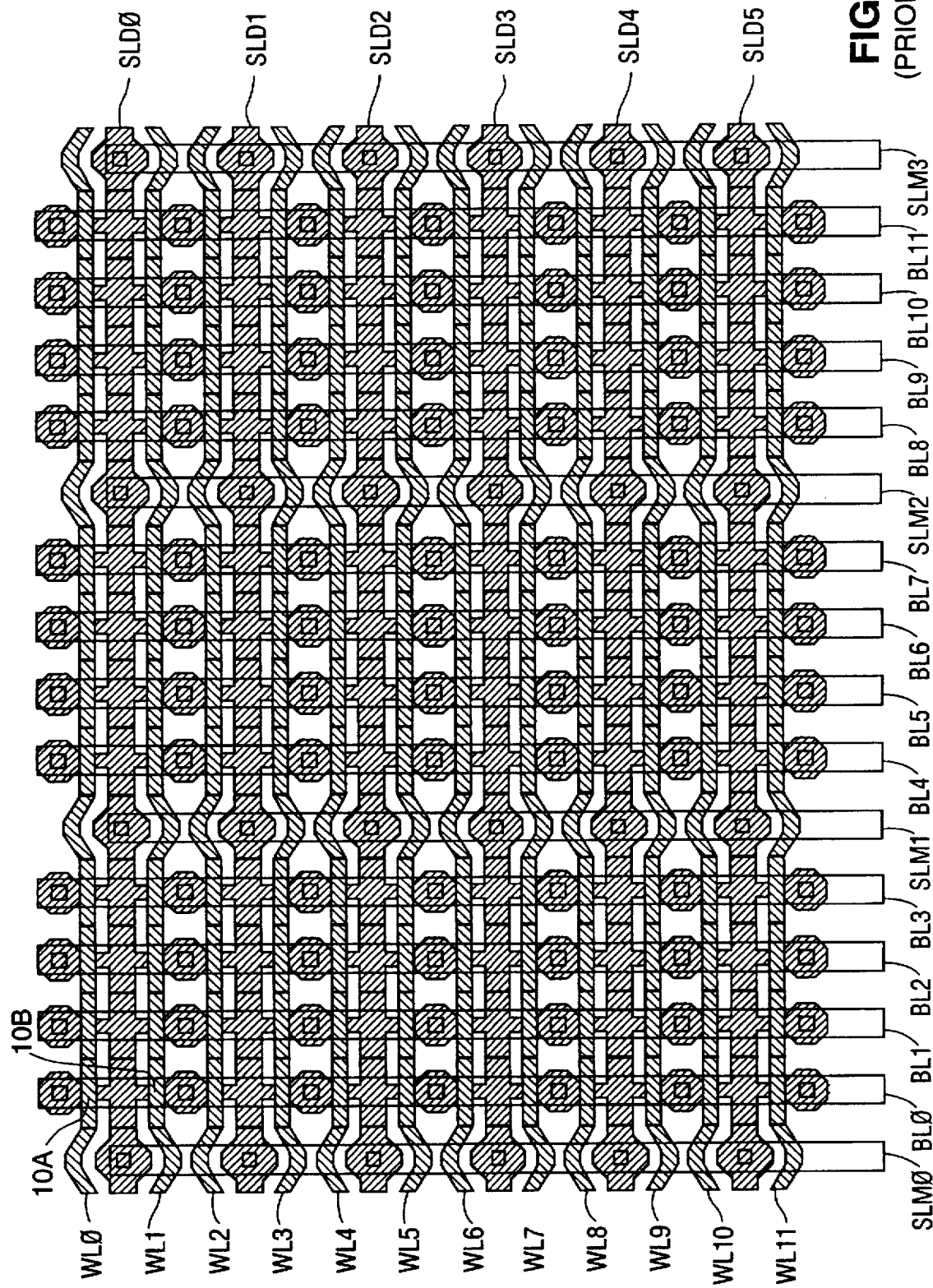
FIG. 3A is a plan view of the conventional layout of an array of flash memory cells.
Figure 3B:
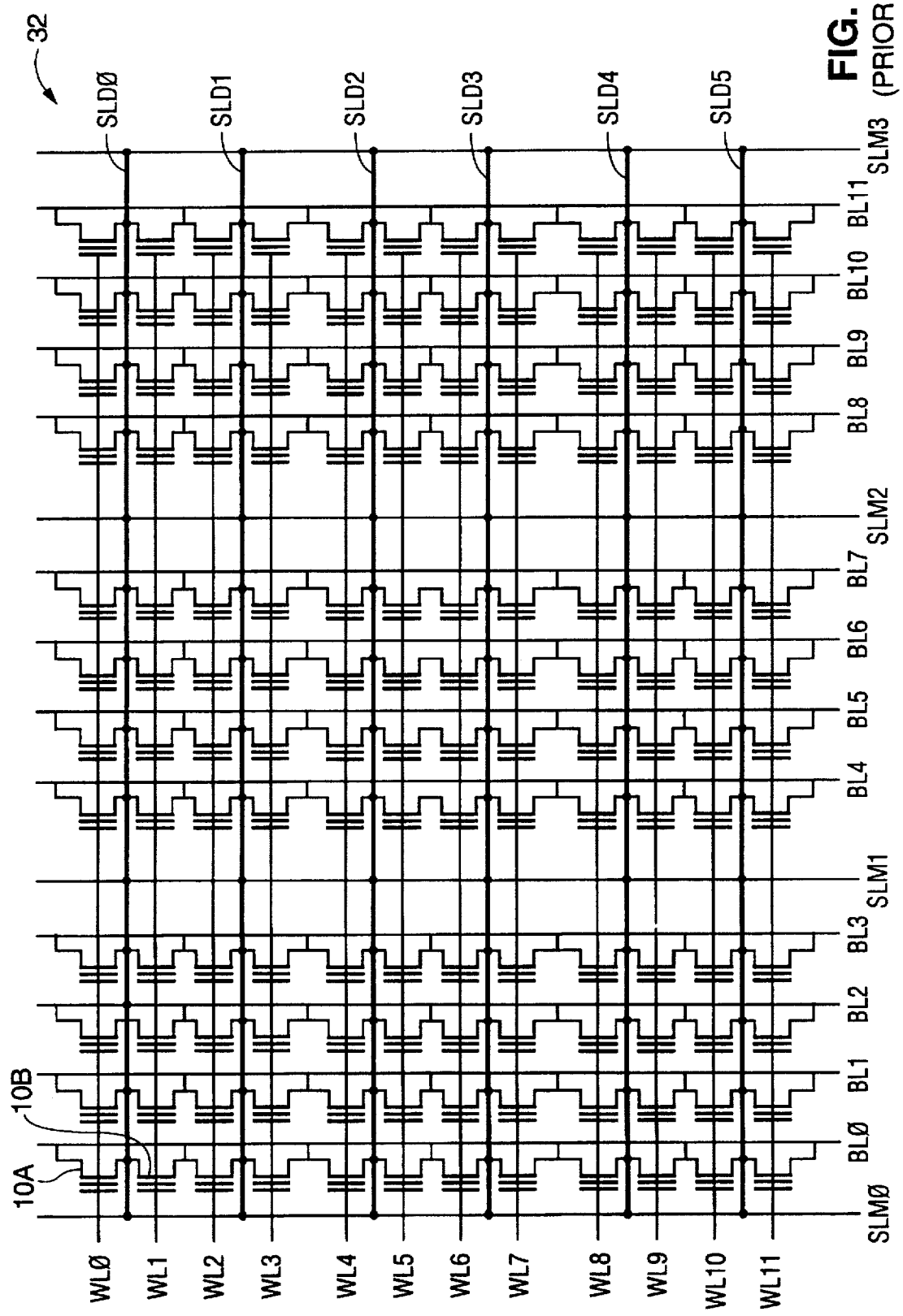
FIG. 3B is a schematic diagram of the memory cell array of FIG. 3A.
Figure 4:
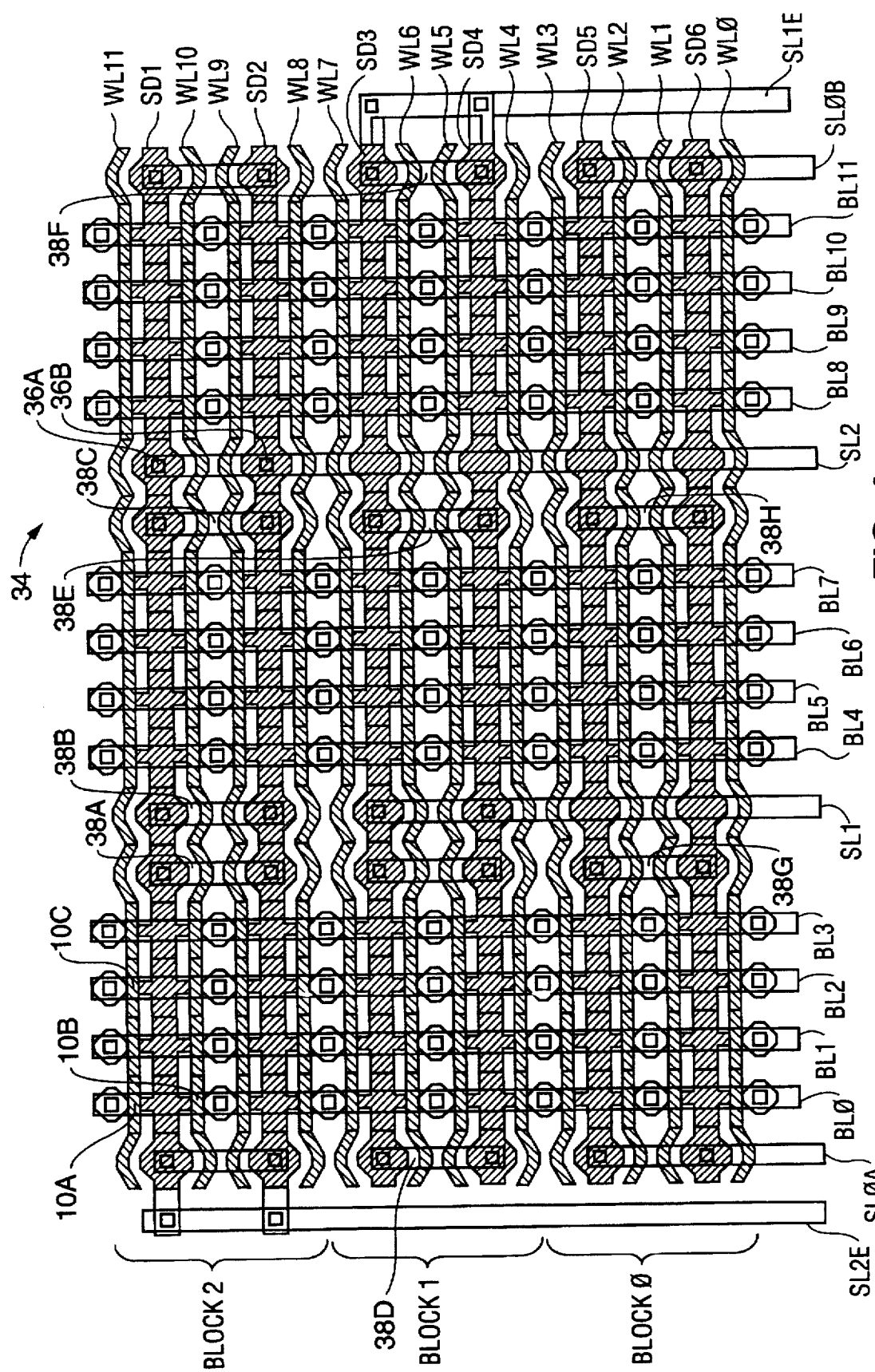
FIG. 4 is a plan view of a layout of one embodiment of a flash memory cell array arrangement in accordance with the present invention.

Referring again to the drawings, FIG. 4 is a plan view of the layout of a portion of a flash cell array 34 in accordance with the present invention. Array 34 is comprised of cells 10 as depicted in FIG. 1. A typical array would be much larger than exemplary array 34. The array is divided into rows and columns. The cells 10 located in a particular row have their control gates all connected to an associated word line. The cells 10 located in a particular column have their drain regions connected to a particular bit line.

Array 34 includes three erase blocks (sometimes referred to as erase segments), Blocks 0-2, each of which has separate source lines that permit each of the erase blocks to be separately erased. Each erase block includes four separate rows of flash cells 10. By way of example, Blocks 0-2 includes four rows associated with word lines WL0-WL3, WL4-WL7 and WL8-WL11, respectively. Further, all of the erase blocks include a set of twelve common columns of cells, namely, the twelve columns associated with bit lines BL0-BL11. Thus, each of the erase blocks can be viewed as including an array of flash cells. Bit lines BL0-BL11 are common to all three erase blocks.

Array 34 is fabricated using a single metal layer process so as to simplify the fabrication process. As is well known, in a single metal layer process, it is not possible for two metal tracks to cross over one another. Typically, connections are made in one direction, such as the vertical direction, using metal tracks and in another direction, such as the horizontal direction, using non-metal tracks, such as doped semiconductor tracks.

The erase blocks each include a source line structure which is connected to all of the source regions of the cells located in the erase blocks. The source line structure includes a plurality of horizontal source lines which function to interconnect all of the source regions of cells located in one of the rows. The source line structure further includes vertical source lines and source straps which function to interconnect all of the source regions of cells located in one of the columns. The horizontal source lines are doped semiconductor source line segments intermediate two adjacent word lines. By way of example, Erase Block 2 includes a first horizontal doped semiconductor segment SD1 intermediate word lines WL10 and WL11 and a second doped segment SD2 intermediate word lines WL8 and WL9. The two doped source line segments SD1 and SD2 of Erase Block 2 extend across the entire width of the array and contact the common source regions of cells 10 on either side of the source line segments. Thus, for example, source line segment SD1 of erase Block 2 is connected to the common source regions of cell 10A and 10B in the rows associated with word lines WL11 and WL10, respectively, and to all of the other cells located in those rows. Doped source line segment SD2 is connected to the common source regions in the cell 10 located in the two rows associated with word lines WL8 and WL9.

The two doped source line segments SD1 and SD2 of Erase Block 2 are connected to a vertical metal source line SL2 by way of contacts 36A and 36B. Metal source line SL2 extends over Erase Blocks 0 and 1 and out of the array 34 so that the sources of the cells in Erase Block 2 can be connected to a source line decoder circuit (not depicted) external to the array 34. Line SL2 does not make contact with either erase Block 0 and 1.

Figure 5:
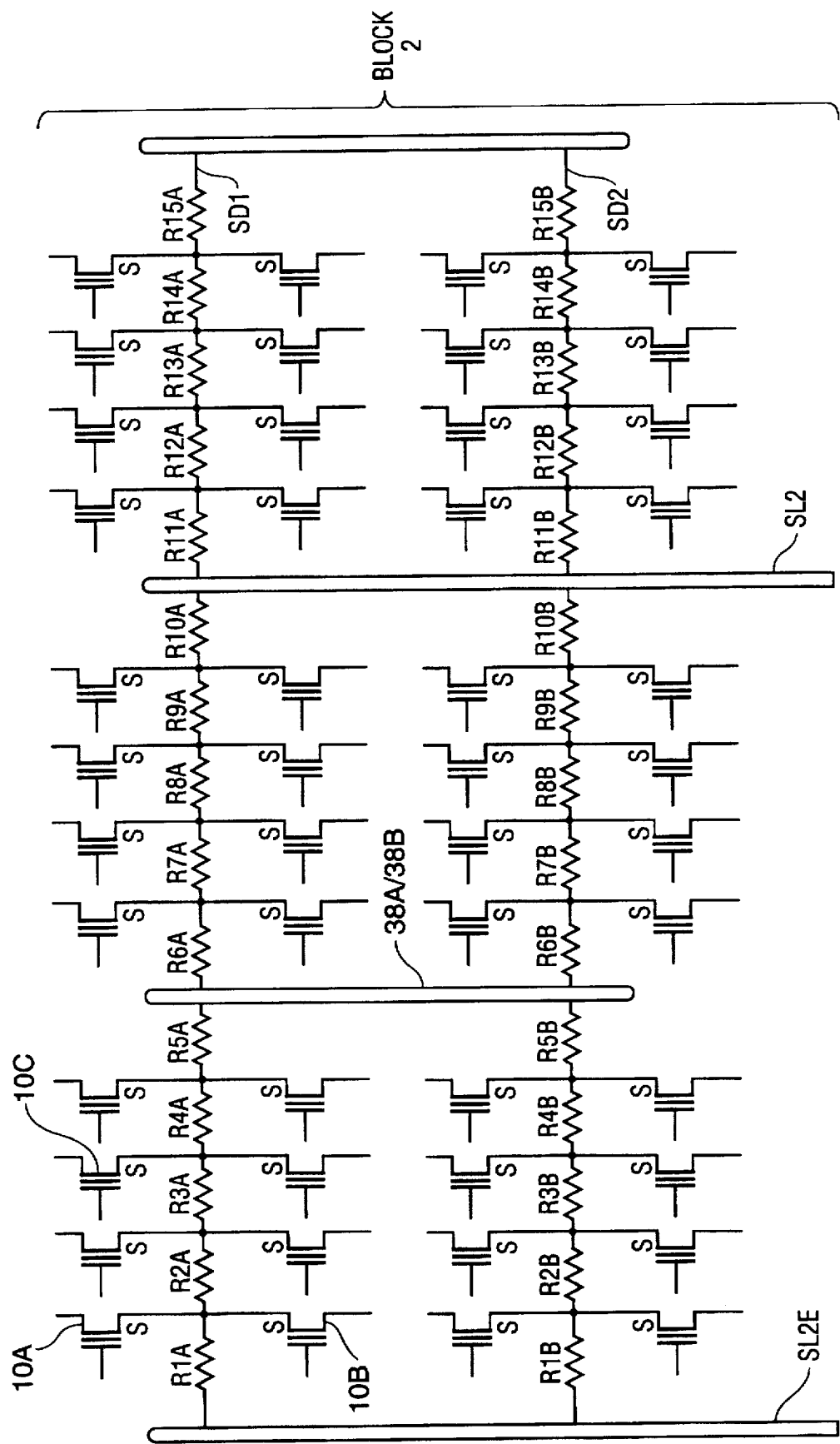
FIG. 5 is a schematic diagram of showing an equivalent circuit for one of the erase blocks of the FIG. 4 array arrangement.

FIG. 5 is a schematic diagram showing the series resistances associated with the doped source lines SD1 and SD2 of Erase-Block 2. Source line SD1 is represented by series-connected resistors R1A-R15A of equal value, with each resistor representing the source line resistance between adjacent cell columns. Similarly, resistors R1B-R15B represent the source line resistance of doped source lines SD2. In order to reduce the adverse effects of such resistance, the doped segments are periodically connected together a fixed number of bit lines by a vertical metal track. In the FIG. 4 embodiment, the doped segments SD1 and SD2 of erase Block 2 are connected together at one location by metal source line SL2 intermediate bit lines BL7 and BL8. The diffused segments SD1 and SD2 are further connected together at a location intermediate bit lines BL3 and BL4 by a pair of metal source straps 38A and 38B. Preferably, the doped source lines are connected together by either a metal source line or a metal source strap every N number of bit lines, with N being equal to four in the FIG. 4 embodiment. Although two straps may be used at one location to simplify fabrication, the two straps are electrically equivalent to a single strap so that the second strap may be deleted. Similarly, source strap 38C is positioned adjacent metal source line SL2 and thus also does not function to reduce the resistance, but is present to simplify the manufacturing process.

As can be seen in FIGS. 4 and 5, each erase block is provided with multiple source lines. The metal source lines extend out from the array 34 and are electrically connected together and to a source line decoder circuit (not depicted) which permits a selected erase block to be erased. As can be seen in FIGS. 4 and 5, Erase Block 2 includes the previously-described metal source line SL2 and an edge metal source line SL2E which is electrically connected to the two doped source lines SD1 and SD2 at the edge of array 34. The edge metal source lines SLE2 is electrically connected to metal source line SL2 outside the array, typically near the source line decoder circuit.

Erase Block 1 (FIG. 4) includes four rows of cells 10 associated with word lines WL4–WL7 and a pair of doped source lines SD3 and SD4. Lines SD3 and SD4 are connected together at one location intermediate bit lines BL3 and BL4 by a metal source line SL1. Metal source line SL1 extends over, but does not make electrical contact with, erase Block 0 and extends out of the array 34 for connection to the source line decoder circuitry external to the array 34.

Erase Block 1 further includes a metal source strap 38D located four bit lines over from metal source line SL1 and adjacent to bit line BL0. A further metal source strap 38E is located four bit lines away in the opposite direction, intermediate bit lines BL7 and BL8. Another metal source strap 38F is located another four bit lines away adjacent bit line BL11. Finally, a second metal source line SL1E, located at the edge of the array, functions to connected the doped source lines SD4 and SD5 together and to the source line decoder external to the array.

Erase Block 0 includes a pair of doped source lines SD5 and SD6 which are associated with four rows of cells 10. Each row has an associated word line WL0–WL3. Block 0 includes the same twelve columns as are present in Blocks 1 and 2 including the columns associated with bit lines BL0–BL11. A first metal source line SL0A is connected to the doped source line segments SD5 and SD6 at a location adjacent bit line BL0. A second metal source line SL0B located adjacent bit line SL0B is located at the other end of the array adjacent bit line BL11. Since the two metal bit lines SL0A and SL0B are located at the opposite ends of that array, it is not necessary to provide edge metal source lines, such as lines SL0E and SL1E used in connection with Blocks 0 and 1. Erase Block 0 includes a first metal source strap 38G located adjacent bit line BL3 and a second metal source line 38H, both interconnecting the diffused source lines SD5 and SD6.

As previously noted, the metal lines of the array occupy a significant amount of chip area. Thus, in order to reduce the amount of area occupied by the metal source lines and the metal source straps, the two lines and straps are positioned in vertical alignment where possible. By way of example, metal source line SL1 and metal source strap 38B are in alignment so that the horizontal area occupied is reduced. As a further example, metal source line SL0A and metal source strap 38D are aligned so as to conserve space.

The FIG. 5 diagram of Erase Block 2 illustrates that no cell is more than two bit lines BLN away from either metal source line going to the outside (as SL2E or SL2) or a strap (as 38A or 38B). This limits the maximum source line resistance for a worst case cell 10, such as cell 10C, to less three time R, where R is equal to the value of any of the individual source line resistances R1A–R15A. The metal source straps 38 interconnecting the doped source lines SD1 and SD2 function to further reduce the maximum source line resistance. The metal source straps and the metal source lines are located such that they alternate a fixed number of bit lines, such as four bit lines in the FIG. 4 and 5 embodiment.

Figure 6:
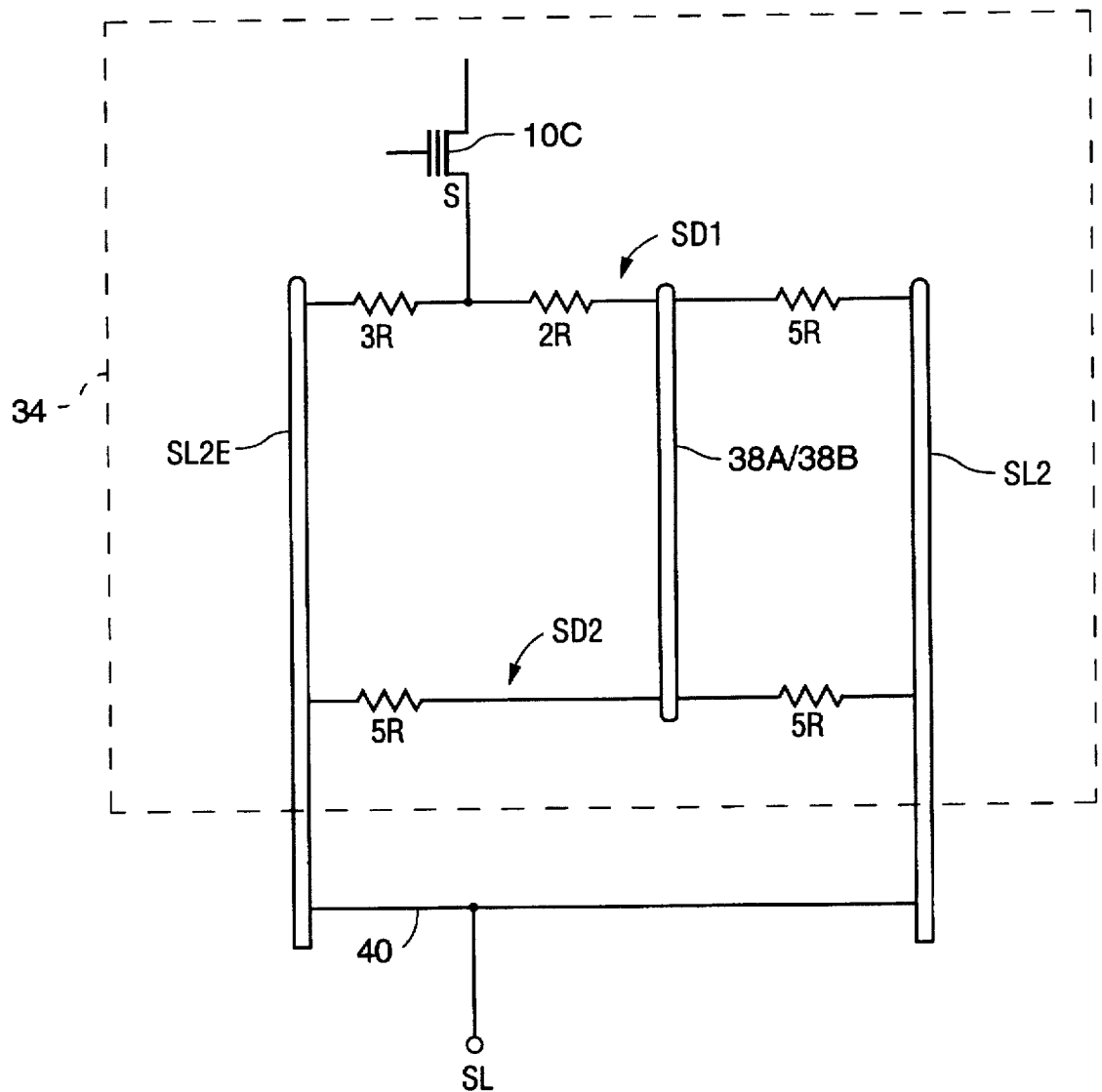
FIG. 6 is a schematic diagram showing an equivalent circuit for determining the worst case source line resistance for an exemplary cell of the FIG. 4 array arrangement.

It can be seen from examination of the FIG. 5 array that cell 10A will have a source line resistance not greater than the value of equivalent resistor R1A. Other cells 10 of the array will have a greater resistance, with the overall performance of the array being limited by the cell with the worst case resistance. FIG. 6 is schematic diagram of an equivalent circuit of a portion of erase Block 2 of the FIG. 4 and 5 array.

Exemplary cell 10C is shown since this cell is located such that it is among the cells which will have the largest source line resistance. Cell 10C is disposed three equivalent resistances (R1A–R3A) away from metal source line SL2E hence the resistor value 3R is shown connected between the cell and the source line. Cell 10C is further disposed two equivalent resistances (R4A–R5A) away from metal source strap 38A/38B hence the value 2R shown connected to the cell. The strap 38A/38B is shown connected to the metal source line SL2 by way of parallel resistors 5R which represent equivalent resistors R6A–R10A and R6B–R10B, respectively. Finally, equivalent resistor 5R representing resistors R1B–R5B, is shown connected metal source line SL2E and metal strap 38A/38B. The two metal source lines SL2E and SL2 are connected together by a line 40 external to array 34.

The total effective resistance between the source of cell 10C and the source line SL for erase Block 2 can readily be calculated using simple arithmetic. The total effective resistance is equal to parallel combination of $3R\|(2R+5R/3)$. This give an effective approximate equivalent source resistance of 1.6R. If the metal source strap were deleted, the worst case cell would be cell 10E, with an equivalent source resistance of approximately 2.5R.

Figure 7:
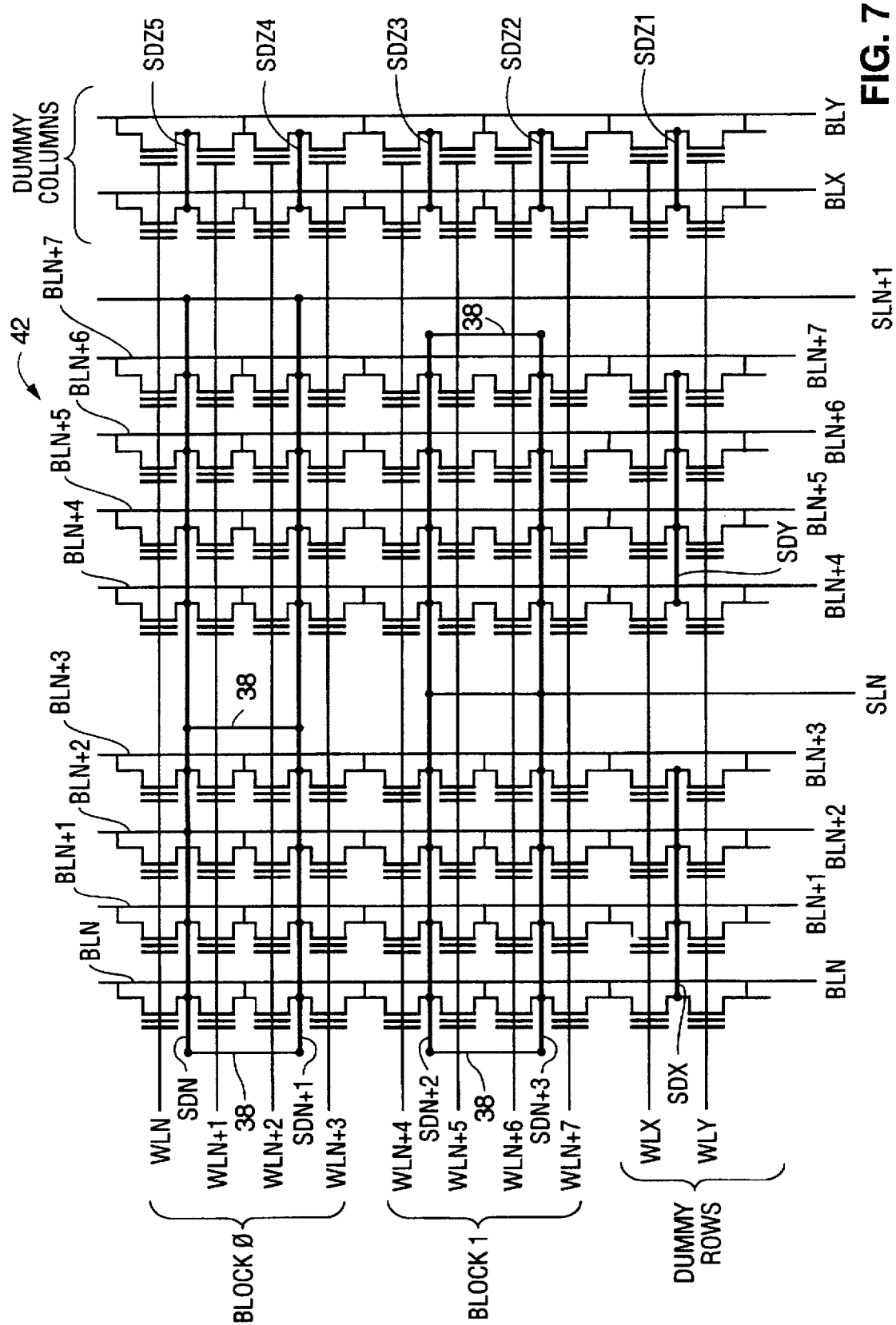
FIG. 7 is a schematic diagram of another embodiment of a flash memory cell array arrangement in accordance with the present invention.

FIG. 7 depicts a portion of another array 42 in accordance with the present invention. Only a corner portion of the array is depicted, including a portion of an Erase Block 0 and an Erase Block 1. Erase Block 1 has one metal source line SLN depicted, with there being additional metal source lines also associated with Block 1. Erase Block 0 has one metal source line SLN+1 depicted, with there being additional metal source lines associated with Block 1. Those lines, which extend over Block 0 but do not make contact to Block 0, are also not depicted in that portion of array 42 shown in FIG. 7.

As was the case with the FIG. 4 embodiment, the doped source lines of each erase block are connected together every four bit lines by either a metal source line or by a metal source strap. By way of example, erase Block 0 has two associated doped source lines SDN and SDN+1 which are connected together by metal straps 38 and source lines SLN+1 every four bit lines.

In a typical flash cell array, cells located at the edge of the array are much more subject to processing variations than the cells not located at the edge. Because of this, it is common to refrain from using the cells at the array edge. Such cells, which extend around the perimeter of the array, are sometimes referred to as dummy cells. Array 42 is surrounded by dummy cells including the two columns of cells depicted in FIG. 7 at one edge of the array and two columns not depicted at the opposite edge of the array. The depicted columns are associated with bit lines BLX and BLY. In addition, array 42 includes two rows of dummy cells located at opposite edges of the array, including two rows not depicted and two rows shown in FIG. 7. The depicted rows are associated with word lines WLX and WLY.

The dummy cells have doped source lines which interconnect the source regions of the dummy cells. The doped source lines include lines SDZ1–SDZ5 of the two dummy columns and lines SDX and SDY of the two dummy rows. Typically, the bit lines BLX and BLY are not accessed since the dummy cells are not supposed to be programmed. If the source lines of the dummy cells, such as source line SDZ5 were to be connected to the source lines of the array, such as line SDN, the dummy cells would be erased when the array is erased. Since the dummy cells cannot be programmed but would otherwise be erased, the dummy cells are likely to become overerased so that they will conduct cell current even when the associated word line is grounded. The flow of current through an overerased cell will usually prevent proper operation of the array by creating a leakage path between the sources of different erase blocks. In order to ensure proper operation of the array of the present invention, the doped source lines of the dummy rows should not be in electrical contact with the doped source lines of the corresponding rows of the functional cells of the array. By way of example, diffused source line SDN of the rows associated with word lines WLN and WLN+1 does not extend to the diffused source line SDZ5.

In addition, the dummy cells located in the dummy rows would have a tendency to be erased when functional cells located in the same column are repetitively programmed. This phenomenon is sometimes referred to as bit line disturb where the dummy cells sharing a bit line with functioning cells would have some tendency to become overerased and thus become leaky. In order to reduce the likelihood of this occurring, the length of the source lines of the dummy cells are made short so as to minimize the possibility of a leakage path between bit lines. By way of example, source lines SDX and SDY of the two dummy rows are not connected so as to minimize any adverse effects of bit line disturb.

Figure 8:
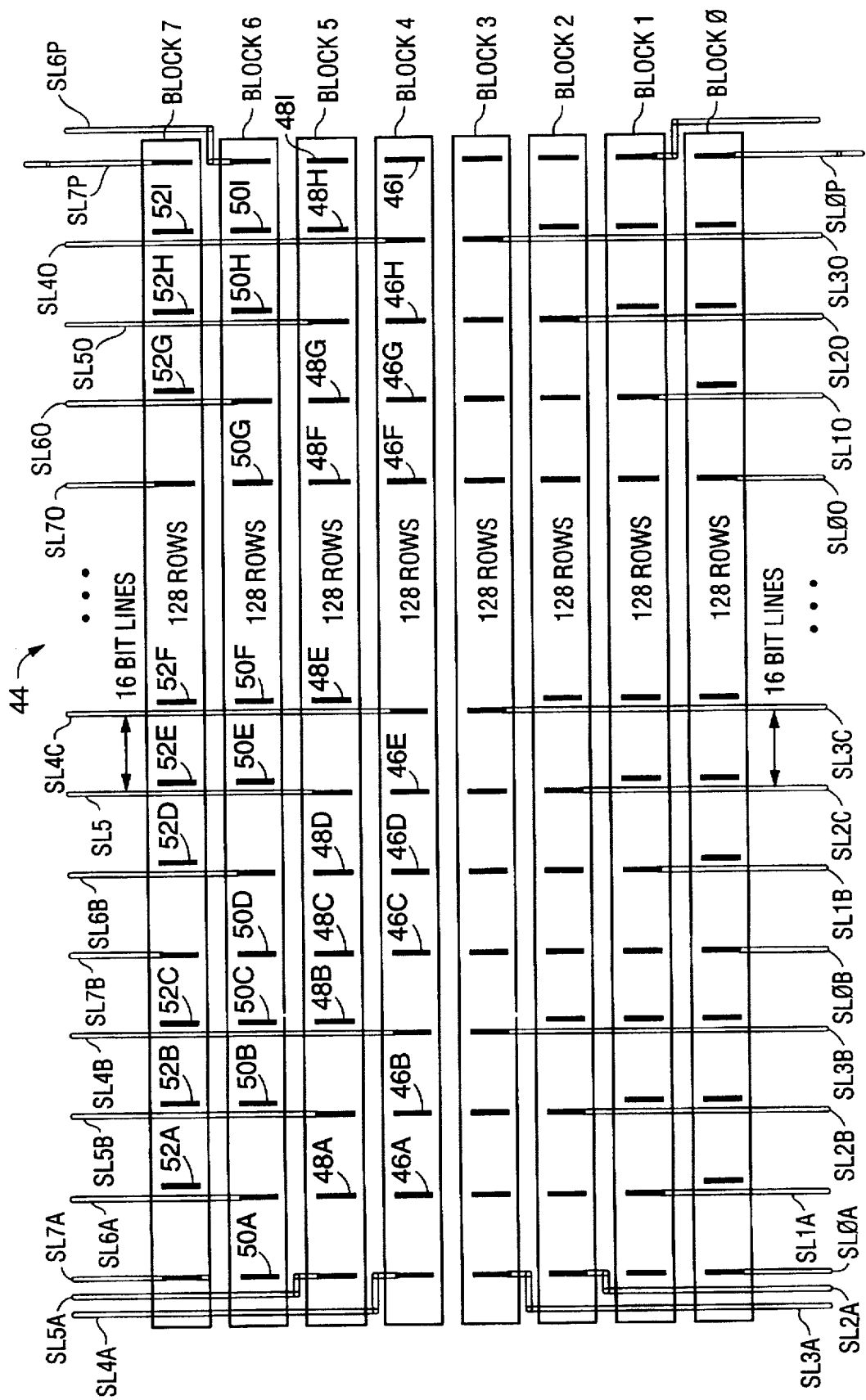
FIG. 8 is a diagram illustrating the layout of a flash memory cell array arrangement in accordance with the present invention having eight separate erase blocks and depicting the location of the metal source connect lines and the metal source straps.

FIG. 8 show a further embodiment of an array 44 in accordance with the present invention showing essentially only the source line connections. Array 44 is comprised of eight erase Blocks 0-7, with each of the erase blocks having 128 rows of flash cells. Thus, array 44 has a total of 1024 rows of cells. Array 44 also has 1024 columns of cells so that the total array capacity is one Megabit. Each erase block can be considered an array of cells having 128 rows and 1024 columns. As can be seen from FIG. 8, erase Blocks 0-3 and erase Blocks 4-7 are mirror images of one another.

Each of the erase blocks has several vertical metal source lines SLN which are electrically connected to all of the hall of the horizontal doped source lines (not depicted) of the erase block. The metal source lines SLN are provided a minimum of every 64 bit lines for each erase block, with the variation being due to the presence of edge metal bit lines. By way of example, Erase Block 4 will have 16 metal source lines, including lines SL4A, SL4B, SL4C . . . and SL4O. Each of the erase blocks also includes several metal source straps which electrically connect all of the diffused source lines of the erase block together. Erase Block 4 includes, for example, metal straps 46A-46I. The metal source straps are internal to the erase blocks and do not extend past the edges of the associated erase block. There are typically three metal source straps intermediate adjacent metal source lines so that there is either a metal source strap or a metal source line located every 16 bit lines of each erase block.

The metal source lines SL4A-SL4O of Erase Block 4 extend over Erase Blocks 5-7 and away from array 44 where they are connected together to form a common source line for Erase Block 4. The metal source lines from Block 4 extend over the other blocks along a path which is parallel with the bit lines of the block and orthogonal to the word lines. As will be explained, the metal source lines from Erase Block 4 (and the other erase blocks) are coupled to a source lined decoder circuit external to array 44 (not depicted).

Erase Block 5 includes metal source lines SL5A-SL5 which are also spaced apart about every 64 bit lines. The metal source lines of Erase Block 5 extend over Erase Blocks 6 and 7 and out of array 44 where they are electrically connected to the source line decoder. Erase Block 5 also includes metal source straps 48A-48I. The straps, like the straps of Block 4, interconnect all of the horizontal doped source lines of Block 5. There are typically three metal source straps intermediate adjacent metal source lines, with there being either a metal source line or a metal source strap every sixteen bit lines.

Erase Blocks 6 and 7 include metal source lines (SL6A-SL6P and SL7A-SL7P, respectively) and metal source straps (50A-50I and 52A-52I, respectively) which are positioned in the same manner as the lines and straps in Blocks 4 and 5. Note that the location of the metal source straps are selected so that they generally align with the metal source lines of adjacent erase blocks. By way of example, metal source straps 52B, 50B, and 46B of Erase Blocks 7, 6 and 4, respectively, are generally aligned with metal source line SL5B of Block 5. As a further example, metal source straps 46C, 48C and 50D are generally aligned with metal source line SL7B.

As previously noted, Blocks 0-3 and Blocks 4-7 are arranged so that they are mirror images of one another. The metal source lines of Blocks 0-3 all extend toward to lower edge of array 44 and the metal source lines of Blocks 4-7 all extend in the opposite direction towards the top edge of the array.

By dividing the erase blocks into two groups of blocks with each group of blocks having metal source lines extending in the opposite direction, a reduction in the amount of chip area occupied by the metal source lines is reduced. By way of example, metal source line SL3C of Erase Block 3 and metal source line SL4C of Erase Block 4 can be made to occupy the same vertical path on array 44 since they extend in opposite directions.

Figure 9:
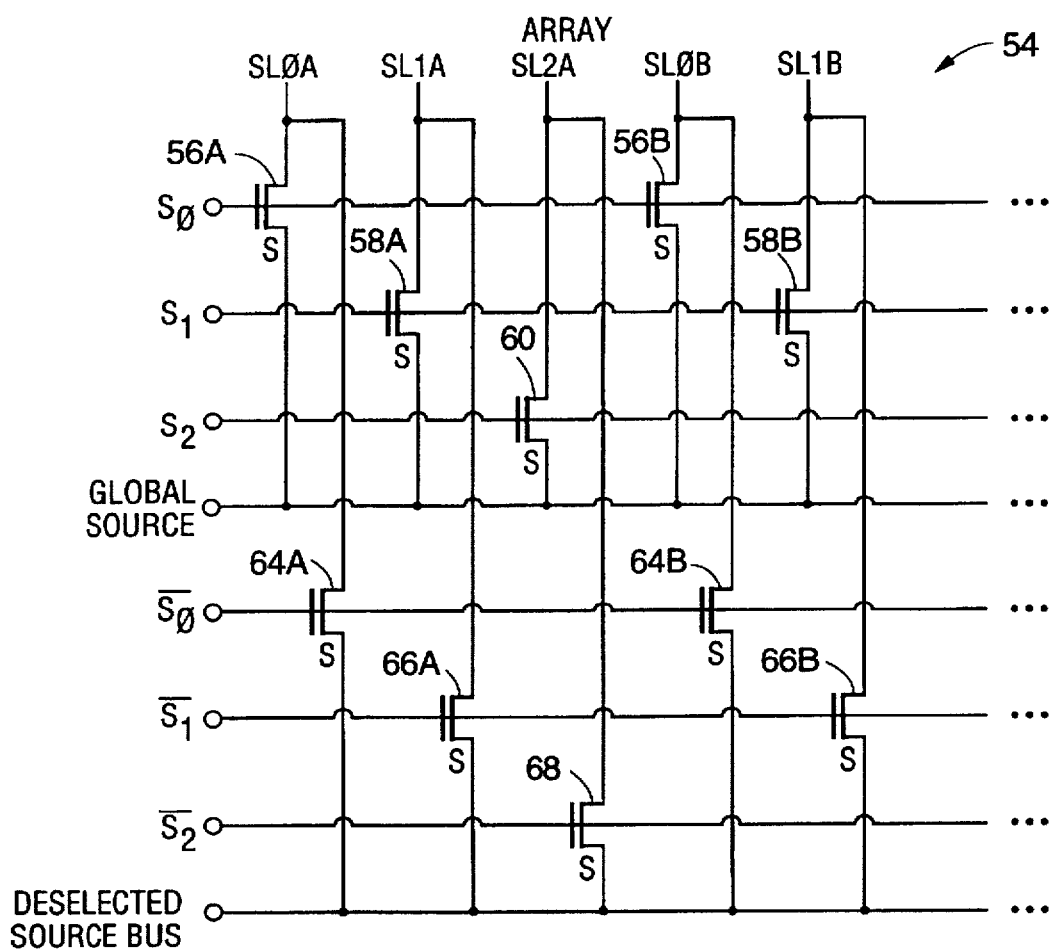
FIG. 9 is a schematic diagram of an erase source decoder circuit for use with an array having three erase blocks.

FIG. 9 is a schematic diagram of an exemplary section of one embodiment of a source line decoder circuit 54 which can be used in connection with an array having a total of three erase blocks. Circuit 54 includes a set of N channel source line decode transistors 56, 58 and 60 connected to the respective source lines of the array. The function of the decode transistors is to connect the source lines coming from a common selected erase block of the array to the same desired potential/condition and to connect the source lines from the deselected erase blocks to a desired potential/condition.

By way of example, the source lines from Erase Block 0, including depicted lines SL0A and SL0B are connected to decode transistors 56A and 56B, respectively. Transistors 56A and 56B, and other decode transistors not depicted which are connected to any additional source lines of Erase Block 0 and have their gates connected to a common line which carries control signal $S_0$. Source lines from Erase Block 1, including depicted lines SL1A and SL1B, are connected to decode transistors 58A and 58B, respectively. Transistors 58A and 58B, and any other transistors not depicted which are connected to any additional source lines of Erase Block 1, have their gates connected to a common line which carries control signal $S_1$. Erase Block 2 has one source line SL2A depicted in FIG. 9 which is connected to transistor 60. A control line carrying signal $S_2$ is connected to the gate of transistors 60 and to the gate of any additional decode transistors which receive other source lines of Erase Block 2. All of the transistors of source decoder circuit 54 controlled by control signals $S_0$, $S_1$ and $S_2$ have their source electrodes connected to a common Global Source line.

Each of the source lines of Erase Blocks 0, 1 and 2 are also connected to separate N channel transistors 64, 66 and 68 which function to selectively connect the source lines to a common Deselected Source Bus. As will be explained, the Deselected Source Bus may be set to some voltage or may be grounded. By way of example, transistors 64A and 64B are connected to source lines SL0A and SL0B of Erase Block 0. The gates of transistors 64A and 64B are controlled by signal $\overline{S_0}$ which is the complement of signal $S_0$. Source lines SL1A and SL1B of Erase Block 1 are connected to transistors 66A and 66B, respectively, with transistors 66A and 66B having their gates connected to a common line which carries signal $\overline{S_1}$, the complement of signal $S_1$. Transistor 68 is controlled by signal $\overline{S_2}$, the complement of signal $S_2$, and is connected to source line SL2A of Erase Block 2.

Table 2 below shows the manner in which the source decoder circuit 54 is controlled in basic memory operations. In a memory read operation, all of the source lines of all of the erase blocks are to be connected to ground. Thus, as can be seen from

TABLE 2

| | ERASE SOURCE DECODER | | |
|---|---|---|---|
| SIGNAL | READ (BLOCK 0) | PROGRAM (BLOCK 0) | ERASE (BLOCK 0) |
| $S_0$ | +5 volts | +5 volts | +12 volts |
| $S_1$ | +5 volts | +5 volts | 0 volts |
| $S_2$ | +5 volts | +5 volts | 0 volts |
| $\overline{S_0}$ | 0 volts | 0 volts | 0 volts |
| $\overline{S_1}$ | 0 volts | 0 volts | +12 volts |
| $\overline{S_2}$ | 0 volts | 0 volts | +12 volts |
| GLOBAL SOURCE | 0 volts | 0 volts | +10 volts |
| SL0 | 0 volts | 0 volts | +10 volts |
| SL1 | 0 volts | 0 volts | 0 volts |
| SL2 | 0 volts | 0 volts | 0 volts |

Table 2, signals $S_0$, $S_1$ and $S_2$ are made active (connected to voltage $V_{CC}$) so that transistors 56A, 56B, 58A, 56B and 60 are all rendered conductive. The Global Source signal is brought to ground level so that all of the source lines of the array (SL0, SL1 and SL2) are at ground level.

Table 3 below shows the conditions for the other portions of the array, including word lines and bit lines, for carrying out memory read, program and erase operations. As can be seen from Tables 2 and 3, and as noted above, in memory read operations, the selected source line (the source lines of the erase block containing the cells to be read) are grounded as are the deselected source lines (the source lines of the other erase blocks). This is accomplished by setting signals S0, S1 and S2 to +5 volts which causes transistors 58B, 58A, 60, 56B and 58A to be conductive thereby connecting all three source lines SL0, SL1 and SL2 to the Global Source line. The Global Source line is at ground potential so that all of the source lines are grounded. Signals $\overline{S0}$, $\overline{S1}$ and $\overline{S2}$ are all at ground potential during read operations so that transistors 64A, 66A, 68, 64B and 66B are off.

TABLE 3

| FUNCTION | READ | PROGRAM | ERASE |
|---|---|---|---|
| SELECTED WORD LINE | +5 volts | +11 volts | N/A |
| DESELECTED WORD LINE SELECTED BLOCK | 0 volts | 0 volts | 0 volts |
| DESELECTED WORD LINE | 0 volts | 0 volts | 0 volts |

TABLE 3-continued

| FUNCTION | READ | PROGRAM | ERASE |
|---|---|---|---|
| DESELECTED BLOCK | | | |
| SELECTED BIT LINE | +1 volt | Data = 0 +6 volts Data = 1 0 volts | N/A |
| DESELECTED BIT LINE | float | float | float |
| SELECTED SOURCE LINE | 0 volts | 0 volts | +10 volts |
| DESELECTED SOURCE LINE | 0 volts | 0 volts | 0 volts |

In addition, the word line associated with the cells being read (the selected word line) is connected to +5 volts and all of the other word lines in the array are grounded. The bit lines of the cells being read (eight cells if the memory word length is eight bits) are connected to a small positive voltage such as +1 volt. All other bit lines of the array are left floating, as can also be seen from Table 3. This combination of conditions will cause the selected cells to either conduct or not conduct current based upon their programmed state.

In order to program a cell (or cells), a relatively large positive voltage of +11 volts is applied to the word line associated with the cell being programmed. All of the other word lines of the array, including those in the same erase block, are grounded. The bit line of the cell to be programmed is connected to +6 volts. If the cell is to be left in the erased state, the bit line is connected to +1 volt. As shown in Table 3, the deselected bit lines are all left floating during programming operations.

As previously noted, an important feature of the present invention is to provide an array which contains separate erase blocks which can be independently erased. Table 2, above, shows the conditions of the erase source decoder when an exemplary erase block, Erase Block 0, is being erased. The Global Source line is set to +10 volts. In addition, signal $S_0$ is set to +12 volts so that transistors 56A and 56B have sufficient gate voltage to apply the +10 volts present on the Global Source line to the source lines SL0A and SL0B associated with the selected erase block, Erase Block 0. The deselected source lines, those associated with the other erase blocks, are all grounded by setting signals $\overline{S_1}$ and $\overline{S_2}$ to +12 volts thereby turning on transistors 66A, 68, 66B. In addition, the Deselected Source Bus is grounded so that the deselected source lines SL1A, SL1B and SL2A are all at ground potential.

Table 3, above, shows the conditions of the remainder of the array in erase operations. All of the word lines, including those of the erase block being erased and the other erase blocks, are grounded. In addition, all of the bit lines of the array are left floating. Under these conditions, all of the cells in Erase Block 0 will be erased.

Table 3 illustrates one set of conditions for reading, programming and erasing a flash array. In that example, a cell is erased by connecting the selected source line to +10 volts, the selected word line to ground and floating the selected bit line. An alternative erase technique can be used wherein a negative voltage is applied to the word line of the cells being erased. That voltage is typically −10 volts. The bit line is left floating and a relatively small voltage $V_A$, such as +5 volts, is applied to the source line of the erase block. As will be explained, the deselected source lines are left floating rather than being grounded as is done in conventional arrays having separate erase blocks. By floating the deselected source lines, certain defects can exist in one erase block which do not interfere with the operation of the remaining erase blocks.

Figure 10:
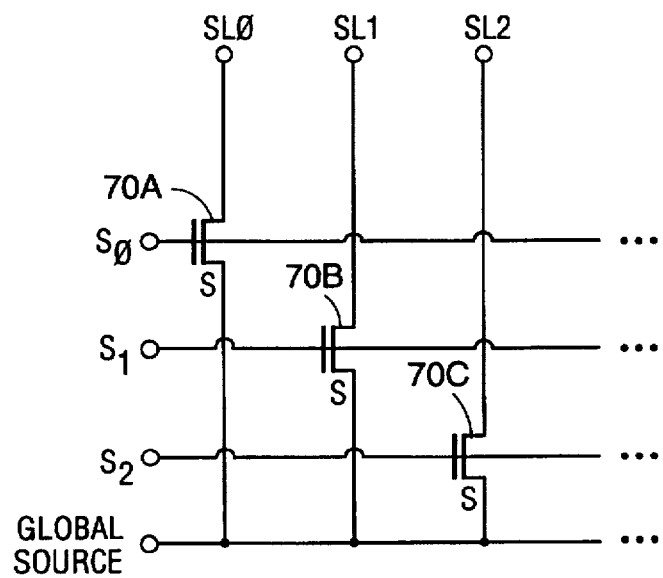
FIG. 10 is a schematic diagram of an alternative erase source decoder circuit.

FIG. 10 depicts an alternative erase source decoder. Table 4 below shows the various signals used in

TABLE 4

| ERASE SOURCE DECODER | | | |
|---|---|---|---|
| SIGNAL | READ (BLOCK 0) | PROGRAM (BLOCK 0) | ERASE (BLOCK 0) |
| $S_0$ | +5 volts | +11 volts | +11 volts |
| $S_1$ | 0 volts | 0 volts | 0 volts |
| $S_2$ | 0 volts | 0 volts | 0 volts |
| GLOBAL SOURCE | 0 volts | 0 volts | $V_A$ |
| SL0 | 0 volts | 0 volts | $V_A$ |
| SL1 | float | float | float |
| SL2 | float | float | float | the FIG. 10 decoder, when the decoder is used in connection with an array utilizing negative gate erase. Referring to FIG. 10, each erase block has a separate source line SL0, SL1, SL2 connected to a separate transistors 70A, 70B and 70C, respectively of the decoder. Transistors 70A, 70B and 70C are controlled by signals $S_0$, $S_1$ and $S_2$, respectively in the event the erase blocks have more than one source line, additional decode transistors are included. Thus, for example, if Erase Block 0 were to have additional source lines, they would each be connected to a transistor controlled by signal $S_0$.

As can be seen from Table 4, when cells in Erase Block 0 are to be read, signal $S_0$ is set to +5 volts thereby turning on transistor 70A (and any other transistors that may be connected to a source line of Erase Block 0). Signals $S_1$ and $S_2$ remain at ground level so that the transistors connected to the remaining erase blocks, including transistors 70B and 70C, are left off. Conducting transistor 70A will connect the source line SL0 of Erase Block 0 to the Global Source line which is, in turn, connected to ground. A positive voltage of +5 volts is connected to the word line associated with the cells being read and the bit lines are connected to a small positive voltage of typically +1 volts. This will cause current to flow or not to flow in the cells being read depending upon whether the cells are in an erased or programmed state. Table 3, above, shows the conditions for the deselected word lines and bit lines during read operations.

In a programming operation where cells in Erase Block 0 are to be programmed, Table 4 indicates that transistor 70A is turned on and transistors 70B and 70C are left off. The Global Source line is set to ground potential so that transistor 70A will cause the source line SL0 to be at ground potential. The deselected source lines SL1 and SL2 will be floating. The word line associated with the cells being programmed is set to a relatively large positive voltage of typically +11 volts. Since this voltage (+11 volts) is generated for programming, the voltage is available for generating signal $S_0$ used to on transistor 70A. Signal $S_0$ could also be +5 volts since transistor 70A is switching at a voltage near ground potential. Further, the bit line associated with the cells to be programmed will be set to a medium level voltage such as +6 volts. If the cell is to be left in the erased state, the associated bit line is grounded. This combination of conditions will permit the selected cells of Erase Block 0 to be programmed.

Continuing, Table 4 indicates that all the cells of Erase Block 0 are erased by setting signals $S_0$, $S_1$ and $S_2$ such that transistor 70A of the FIG. 10 erase decoder is made conductive and the remaining transistors 70B and 70A are off. The Global Source line is set to a relatively low positive voltage $V_A$ which is typically approximately +5 volts or some other value which will not be so large as to result in cell voltage break down. Thus, source line SL0 of Erase Block 0 will be at voltage $V_A$ and the source lines of the remaining erase blocks, lines SL1 and SL2 will be floating. The word lines of Erase Block 0 are all set to a relatively large negative voltage, such as −10 volts, and the bit lines of the array are all left floating. This will result in all of the cells of Erase Block 0 being erased by way of the previously-described negative gate erase technique.

It is possible that a failure of a cell in one erase block will adversely affect operation of the remaining erase blocks. Under certain conditions, a flash cell will conduct current when it should be non-conducting. By way of example, if a cell has been over erased, the cell will have a negative threshold voltage so that the cell will conduct even when the gate-source voltage is 0 volts. Other conditions may occur which will cause a cell to be "leaky" and conduct current when the cell should be non-conductive. When a cell of a deselected erase block is improperly conducting current, the cell has a tendency to clamp the bit line voltage to the source voltage. This can cause the bit line voltage to approach ground potential should the source lines of the deselected erase blocks be set to ground potential as is illustrated in Tables 2 and 3, above. Since the bit lines are common to all of the erase blocks in an array, a defective cell in one block will have a tendency to interfere with the reading, erasure and programming of the other blocks. By floating the source lines of deselected erase blocks during program or read operations, as shown in Table 4, the adverse affects of a leaky or over erased cell in the deselected blocks on the cells of selected erase blocks will be greatly reduced.

Figure 11:
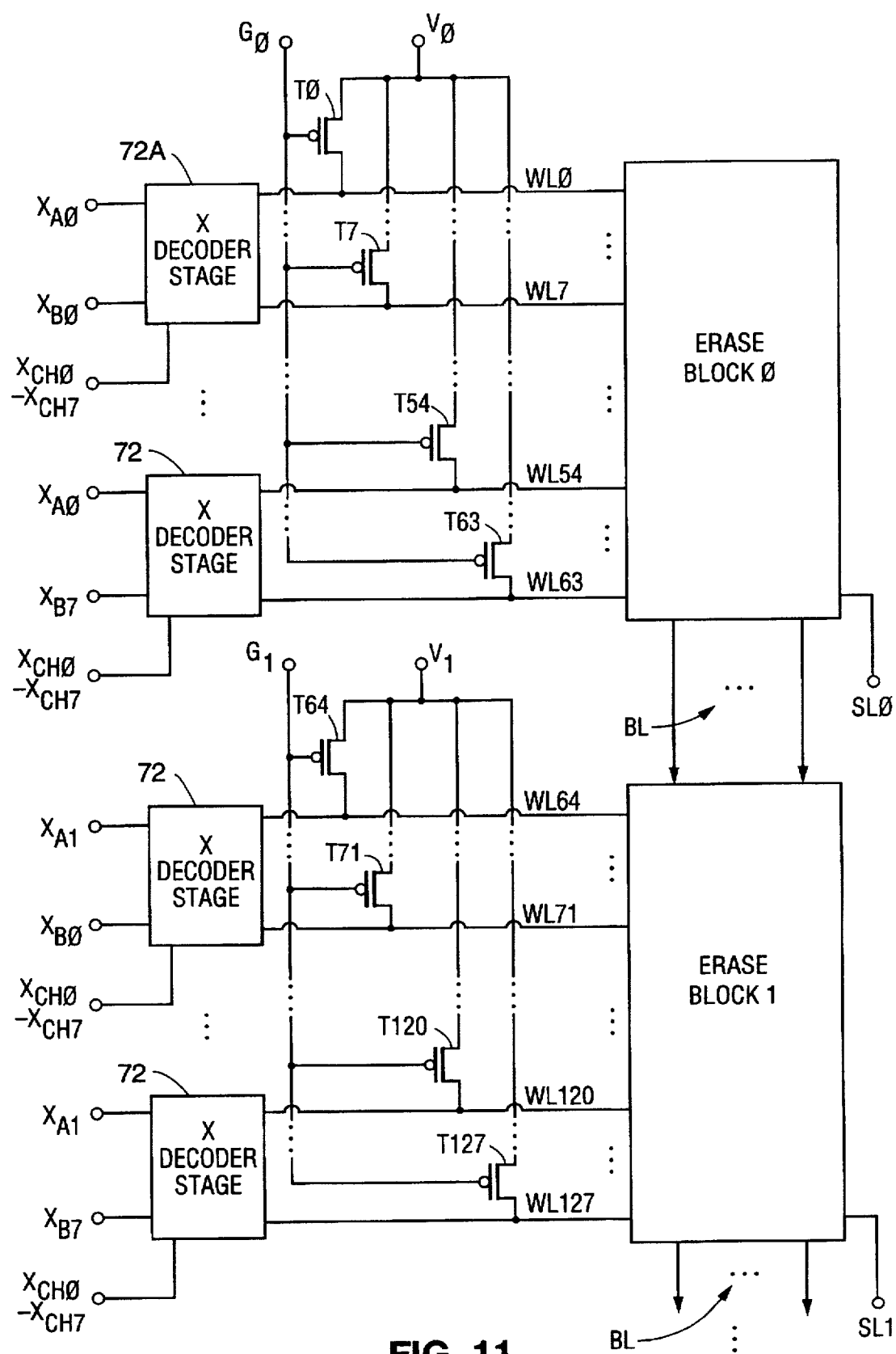
FIG. 11 is a block diagram of a segmented flash array arrangement utilizing negative gate erase techniques.

FIG. 11 depicts a flash cell array arrangement adapted to utilize negative gate erase techniques. Exemplary Erase Blocks 0–1 are depicted, with there being a total of eight erase blocks, including Erase Blocks 2–7 which are not shown. Each erase block has sixty-four word lines WL, a set of bit lines BL common to all of the erase blocks and separate source lines. The word lines are grouped in eights, with each group of eight being connected to a separate X Decoder Stage 72. Thus, for example, X Decoder Stage 72A is connected to word lines WL0–WL7. There are a total of 512 word lines WL0–WL511, with word lines WL0–WL63 being associated with Erase Block 0 and word lines WL64–WL127 being associated with Erase Block 1 and the remaining word lines WL128–WL511 being associated with the remaining six erase blocks that are not depicted.

Each of the word lines WL0–WLS11 also has a separate respective P channel erase transistor T0–T511 connected to it, with the transistors associated with one of the erase blocks being controlled by a common control signal. Thus, erase transistors T0–T63 of Erase Block 0 have their gates connected to a line that carries control signal G0 and erase transistors T64–T127 of Erase Block 1 have their gates connected to a common line that carries control signal G1. In addition, all of the erase transistors associated with an erase block have their sources connected to a common voltage line. Thus, for example, erase transistors T0–T63 are all have their sources connected to a common line that carries a voltage $V_0$.

Figure 13:
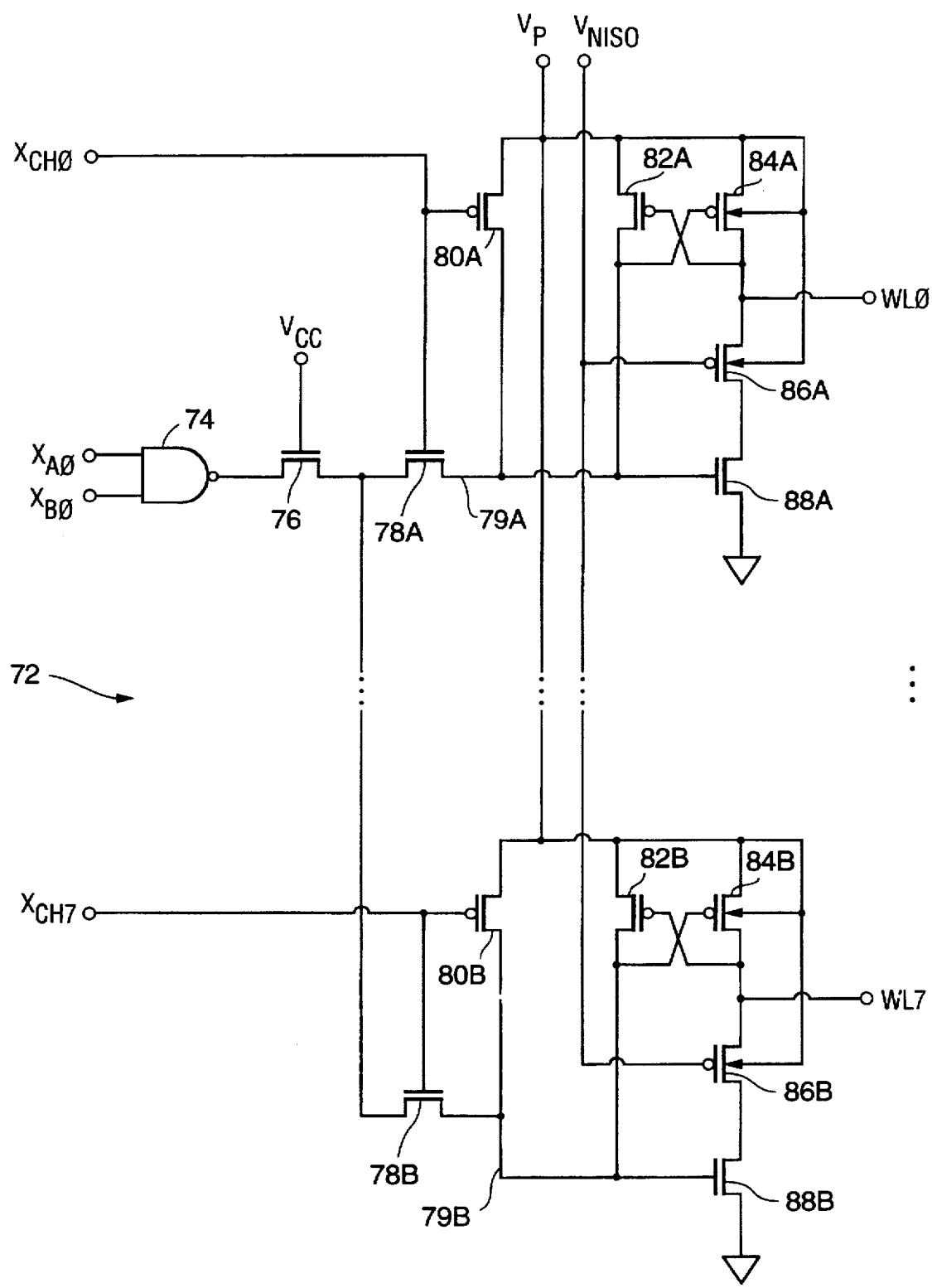
FIG. 13 is a schematic diagram of one of the X Decoder Stages used in the array arrangements of FIGS. 11 and 12.

The details of the X Decoder Stages 72 of FIG. 11 are shown in FIG. 13. As will be explained in greater detail, the X Decoder Stages 72 provide outputs which are either at a positive voltage equal to the X Decoder Stage 72 supply voltage $V_P$, ground potential or a high impedance (at least more than 10 k Ω). The high impedance state of the X Decoder Stages 72 is used when the erase transistors T0–T511 function to apply a negative voltage to the word lines of an erase block during an erase operation, as will be explained in greater detail.

The conditions for carrying out read, program and erase operations on the FIG. 11 array arrangement are set forth in Table 5, below. Erase Block 0 is

TABLE 5

| FUNCTION | READ | PROGRAM | ERASE |
|---|---|---|---|
| $G_0$ | +5 volts | +11 volts | −12 volts |
| $V_0$ | +5 volts | +11 volts | −10 volts |
| $G_1$ | +5 volts | +11 volts | 0 volts |
| $V_1$ | +5 volts | +11 volts | 0 volts |
| X-DECODER SUPPLY $V_P$ | +5 volts | +11 volts | 0 volts |
| WL-BLOCK 0 (SELECTED BLOCK) | selected +5 volts | selected +11 volts | −10 volts |
|  | deselected 0 volts | deselected 0 volts |  |
| WL-BLOCK 1 (DESELECTED BLOCKS) | 0 volts | 0 volts | 0 - $V_T$ |
| SL0 | 0 volts | 0 volts | $V_A$ |
| SL1 (DESELECTED SOURCES) | 0 volts float | 0 volts float | $V_B$ float |
| $V_{NISO}$ | −2 volts | −2 volts | 0 volts | the selected erase block in the Table 5 example. As can be seen from Table 5, if a memory read operation is to occur in Erase Block 0, all of the control signals connected to the gates of the P channel erase transistors T0–T127 (and the erase transistors T128–T511 not depicted) are connected to a positive voltage of +5 volts. That includes signal $G_0$ associated with the selected Erase Block 0 and signal $G_1$ associated with the deselected Erase Block 1. In addition, the voltages $V_0$ and $V_1$ applied to the drains of the P channel erase transistors are all set to +5 volts. The positive voltages applied to the erase transistors causes the transistors to be non-conductive. Accordingly, the state of the word lines will be determined by the X Decoder Stages 72 during memory read operations.

Referring again to FIG. 13, further details of the X Decoder Stage 72 will now be described. The entire X Decoder, which is not depicted, functions to receive nine of the sixteen address bits for the array and decodes those address bit so as to select one of the 512 word lines in memory read and programming operations. The remaining address bits for the memory are used by a Y Decoder (not depicted) to select the appropriate bit lines. X Decoder Stages 72 represent the output portion of the X Decoder for the array. Each X Decoder Stage 72 is associated with eight word lines so that there will be a total of sixty-four X Decoder Stages 72, with eight X Decoder Stages 72 being associated with each of the eight erase blocks. The exemplary FIG. 13 circuitry for X Decoder Stage 72A is associated with eight word lines WL0–WL7 of Erase Block 0.

In order to select one of the 512 word lines, each of the X Decoder Stages 72 receives a total of twenty-four predecode signals. These predecode signals are developed by predecoding circuitry (not depicted) which receives the nine address bits supplied to the X Decoder and converts the nine address bits to twenty-four predecode signals, including signals $X_{A0}$–$X_{A7}$, $X_{B0}$–$X_{B7}$ and $X_{CH0}$–$X_{CH7}$. Signals $X_{A0}$–$X_{A7}$ and $X_{B0}$–$X_{B7}$ are used in combinations of two to select one of the sixty-four X Decoder Stages 72. Signals $X_{CH0}$–$X_{CH7}$ are provided to each of the sixty-four X Decode Stages 72 to select one of the eight word lines associated with each stage. By way of example, X Decode Stage 72A of FIG. 13 receives predecode signals $X_{A0}$ and $X_{B0}$ which function to select that stage from the sixty-four stages. Stage 72A also receives predecode signals $X_{CH0}$–$X_{CH7}$ which are used to select one of the eight word lines WL0–WL7 associated with Stage 72A.

The construction and operation of exemplary X Decode Stage 72A of FIG. 13 will now be described since such description is helpful in understanding Table 5. Predecode signals $X_{A0}$ and $X_{B0}$ are connected to the inputs of a NAND gate 74, the output of which is connected to a level shifting pass transistor 76 which will pass any voltage having a magnitude which is below the supply voltage $V_{CC}$ connected to its gate. Pass transistor 76 is, in turn, connected to a total of eight additional pass transistors, including N channel transistor 78A associated with decode circuitry for word line WL0 and including N channel transistor 78B associated with decode circuitry for word line WL7.

Transistor 78A has its gate connected to receive predecode signal $X_{CH0}$, with predecode signal $X_{CH0}$ also being connected to the gate of a P channel transistor 80A. Transistor 80A is connected between transistor 78A and the X Decoder supply voltage $V_P$. Transistors 78A and 80A are connected to a common node 79A which is near ground potential when predecode signals $X_{A0}$, $X_{B0}$ and $X_{CH0}$ are all at a high level, otherwise node 79A is at a high level. Node 79A is connected to the common gate connection of a P channel transistor 84A and an N channel transistor 88A. These transistors form an inverting stage, the output of which is connected to word line WL0. Transistor 84A is connected between the X Decoder supply voltage $V_P$ and the inverting stage output and transistor 88A is connected between the output, by way of a P channel transistor 86A, and the circuit common. As will be explained, transistor 86A functions to protect N channel transistor 88A from the negative voltage which is which is present on the word line WL0 during erase operations.

In addition to being-connected to word line WL0, the output of the inverting stage is connected to the gate of a feedback P channel transistor 82A, with transistor 82A providing positive feedback which pulls the input of the inverting stage, node 79A, towards supply voltage $V_P$ when the output of the inverting stage, WL0, goes low. This ensures that node 79A will be pulled up to a sufficiently high voltage to turn off P channel transistor 84A.

The remaining seven sections (only the last section is depicted) of X Decoder Stage 72A for driving word lines WL1–WL7 are also connected to the output of NAND gate 74 and pass transistor 76. Otherwise, the construction of the sections is the same. The seven sections each receive respective ones of predecode signals $X_{CH1}$–$X_{CH7}$, so that one of the eight word lines WL0–WL7 can be selected.

Returning to the description of a read operation (Table 5 and FIG. 11) in connection with Erase Block 0, the signals $G_0$–$G_7$ applied to the gates of all of the P channel erase transistors T0–T127 (and those not depicted) are set to +5 volts. Thus, the transistors will be non-conductive. In addition, the X Decoder supply voltage $V_P$ is set to +5 volts. A read address is decoded causing predetermined predecode signals to become active. Assuming, for example, that a cell associated with word line WL7 is to be read, the predecode signals $X_{A0}$ and $X_{B0}$ will go high thereby selecting X Decoder Stage 72A. This will cause the output of pass transistor 76 to go low (FIG. 13). In addition, predecode signal $X_{CH7}$ will go high thereby turning on pass transistor 78B and causing node 79B to go low. The remaining predecode signals, $X_{CH0}$–$X_{CH6}$ will remain low. Transistor 84B will turn on so as to pull up selected word line WL7 to voltage $V_P$, which is set to +5 volts. Note that voltage $V_{NISO}$ is set to –2 volts (Table 5) thereby causing P channel transistor 86B to be conductive. However, since transistor 88B is off, the word line WL7 voltage will still be +5 volts.

As indicated in Table 5, the deselected word lines in the selected Erase Block 0 are set to ground potential. This is accomplished by the nine bit address causing the X Decoder to set the predecode signals $X_{CH0}$–$X_{CH6}$ to a low value, as previously noted. Thus, for example, signal $X_{CH0}$ will cause transistor 78A to turn off thereby isolating node 79A from the low output of NAND gate 74. Signal $\overline{X_{CH0}}$ will also cause transistor 78A to become conductive and pull node 79A up to voltage $V_{CC}$ less the threshold voltage of transistor 79A. This will cause transistor 88A to become conductive, thereby causing the voltage on word line WL0 to drop. This, in turn, will cause transistor 82A to turn on thereby pulling node 79A up further to voltage $V_P$.

As previously noted, voltage $V_{NISO}$ is set to –2 volts so that transistor 86A will also be conductive. Accordingly, transistors 86A and 86B will both be conductive and will pull word line WL0 down to ground potential as will the corresponding transistors associated with deselected word lines WL1–WL6 of Erase Block 0.

With respect to the deselected word lines of the remaining erase blocks, Table 5 indicates that these word lines are also set to ground potential. For all of these deselected erase blocks, the predecode signals XA and XB will such that the output of the corresponding NAND gate 74 output will be at a high level. For those deselected word lines where predecode signal $X_{CH7}$ is used, that predecode will be at a high level in the present example so that transistor 78 will be on thereby connecting the high output of NAND gate 74 to node 79. For those selected word lines where predecode signals $X_{CH0}$–$X_{CH6}$ are used, those predecodes will be at a low level. This will cause the associated transistor 78 to be off thereby isolating node 79 from the output of the NAND gate 74. In addition, associated transistor 80 will be turned on by the low level predecode so that node 79 will be pulled up to voltage $V_P$. In either case, a high voltage at node 79 will cause the associated word line to be at ground potential.

As indicated by Table 5, in read operations, the selected source line, SL0 for Erase Block 0, is grounded. The source lines of the remaining Erase Blocks 1–7, including source line SL1, can also be grounded as shown in Table 5. However, preferably, the deselected source lines are left floating, as also shown in Table 5. This can be accomplished, for example, using the source decoder circuit of FIG. 9. With the array configured as described, a selected cell (or group of cells) associated with a word line (such as line WL7) of Erase Block 0 can be read.

Table 5 also shows the conditions for programming a cell or group of cells of the FIG. 11 array arrangement. Again, all of the P channel erase transistors T0–T511 are turned off since control signals $G_0$ and $G_1$ (and signals $G_2$–$G_7$ not depicted) are all set to a positive voltage (+11 volts). The X Decoder 72 supply voltage $V_P$ is set to +11 volts and the decoding circuitry is caused to apply this voltage to the selected word line based upon the address being used in the programming operation. Thus, for example, if word line WL7 is the selected word line, predecode signals $X_{A0}$, $X_{B0}$ and $X_{CH7}$ (FIG. 13) are all at a high level so that transistor 84B will pull word line WL7 up to voltage $V_P$ set to +11 volts.

The deselected word lines WL0–WL6 of selected Erase Block 0 are set to ground potential in the programming operation since the predecode signals $X_{CH0}$–$X_{CH6}$ associated with the deselected word lines will be at a low level. Voltage $V_{NISO}$ is set to –2 volts according to Table 5 therefore both transistors 86B and 88B will be turned on connecting these deselected word lines to ground as was the case during read operations. In addition, the word lines of the deselected erase blocks will be at ground potential for the same reasons previously set forth in connection with the description of an exemplary read operation. However, it is again preferable that the source line of the deselected erase blocks be left floating in programming operations as is the case of these source lines during read operations.

Figure 12:
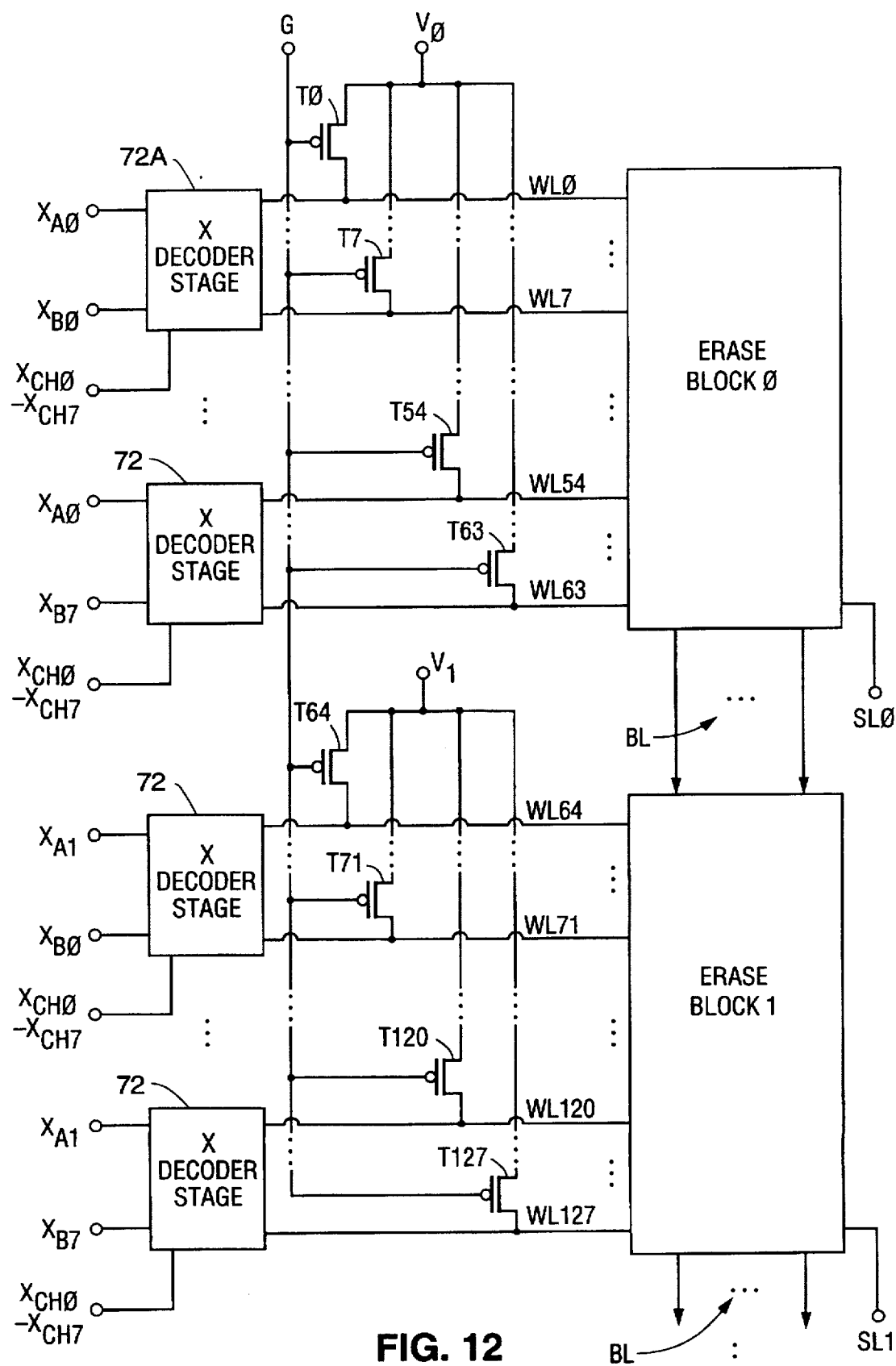
FIG. 12 is a block diagram of an alternative embodiment blocked flash array arrangement utilizing negative gate erase techniques.

In erase operation, a single erase block of the array may be erased as previously described. As can be seen in Table 5, if Erase Block 0 is the selected block to be erased, signal $G_0$ is set to –12 volts thereby turning on erase transistors T0–T63 (FIG. 12). In addition, voltage $V_0$ is set to –10 volts so that all sixty-four word lines of Erase Block 0 are connected to –10 volts by the associated erase transistor T0–T63.

As can also be seen from Table 5, all sixty-four of the X Decoder Stages 72 of the array have their common supply voltage $V_P$ set to ground potential. In addition, voltage $V_{NISO}$ is set to ground potential so that the P channel transistor 86 (FIG. 13) in each of the X Decoder Stages 72 is turned off thereby isolating the N channel transistors 88 from the negative voltage which is applied to the word lines of Selected Erase Block 0.

The erase transistors T64–T511 of the deselected erase blocks are all turned off since the voltage applied to the gates, including $G_1$, is at ground potential. In addition, the associated X Decoder stage 72 output is isolated from the word lines so that the word lines of the deselected erase blocks will be at a high impedance level. The deselected word lines will assume a voltage ranging from ground potential to the threshold voltage $V_T$ of the P channel transistor 84 located in the associated X Decoder Stage 72, as indicated in Table 5. This threshold voltage is typically +1 volt.

The source line of the selected Erase Block 0, source line SL0, is set to voltage $V_A$ which is typically +5 volts. By way of example, the Global Source line of the FIG. 9 source decoder circuit will be set to voltage $V_A$ and signal S0 is made to turn on transistors 56A and 56B. In addition, the voltage of the source lines associated with the deselected erase blocks, such as source line SL1, are set to a voltage $V_B$. This is accomplished by setting the Deselected Source Bus of the FIG. 9 decoder circuit to voltage $V_B$ and turning on the transistors 66A, 66B and 68 associated with the deselected source lines. Voltage $V_B$ is selected to be intermediate threshold voltage $V_T$ and voltage $V_A$ applied to the selected source line. Thus, if threshold voltage $V_T$ is +1 volt and voltage $V_A$ is +5 volts, $V_B$ may be set to +3 volts. If voltage $V_B$ is set too high, there will be an increased tendency for the cells of the deselected erase blocks to be slightly erased each time one of the other erase blocks is erased. This phenomena is sometimes referred to as source erase disturb. If, on the other hand, voltage $V_B$ is too low, there will be a tendency to turn on the deselected flash cells, or to cause them to leak, since the control gate voltage of the flash cells will typically be at voltage $V_T$ due to the previously described influence of the associated X Decoder Stage 72. These conditions will cause the selected Erase Block 0 to become erased. As also indicated by Table 5, the deselected source lines can also be placed in a floating state in erase operations.

FIG. 12 shows an alternative to the FIG. 11 flash array arrangement, with similar elements having the same numerical designation. This array arrangement also utilizes negative gate erase during erase operations. However, rather than having a separate control signal $G_0$–$G_7$ for each of the eight Erase Blocks 0–7, there is single control signal G common to all eight blocks. Other aspects of the FIG. 12 embodiment are the same as that of FIG. 11 with the exception of the differences noted in the following description. Thus, the FIG. 12 array arrangement is somewhat simpler to implement than is the FIG. 11 embodiment.

Table 6 shows the conditions for reading, programming and erasing the FIG. 12 array arrangement. In read operations, signal G is set to +5 volts so that all of the erase transistors T0–T511 are turned off. Similarly, in program operations, signal G is set to +11 volts so that all of the erase transistors are turned off. The X Decoders stages 72 used in the FIG. 12 embodiment are the same used in the previously described FIG. 11 embodiment. Since the erase transistors T0–T511 are in the same corresponding disabled state as in the FIG. 11 embodiment, the conditions created by the X Decoder Stages 72 in read and program operations are the same and need not be further described.

In erase operations, assume that Erase Block 0 is to

TABLE 6

| FUNCTION | READ | PROGRAM | ERASE |
|---|---|---|---|
| G | +5 volts | +11 volts | −12 volts |
| $V_0$ | +5 volts | +11 volts | −10 volts |
| $V_1$ | +5 volts | +11 volts | 0 volts |
| X-DECODER SUPPLY $V_P$ | +5 volts | +11 volts | 0 volts |
| WL-BLOCK 0 (SELECTED BLOCK) | selected +5 volts | selected +11 volts | −10 volts |
|  | deselected 0 volts | deselected 0 volts |  |
| WL-BLOCK 1 (DESELECTED BLOCKS) | 0 volts | 0 volts | 0 volts |
| SL0 | 0 volts | 0 volts | $V_A$ |
| SL1 (DESELECTED SOURCES) | 0 volts float | 0 volts float | $V_B$ float |
| $V_{NISO}$ | −2 volts | −2 volts | 0 volts | be erased. Common signal G is set to −12 volts and voltage $V_0$ associated with Erase Block 0 is set to −10 volts. Thus, erase transistors T0–T63 are turned on thereby connecting all of the word lines WL0–WL63 of Erase Block 0 to −10 volts. The deselected voltages, including $V_1$ are all set to ground potential. Thus, the remaining erase transistors T63–T511 are all turned on thereby connecting all of the deselected word lines WL64–WL511 to ground. As also indicated by Table 6, the selected source line SL0 is set to voltage $V_A$ which, as previously noted, is typically +5 volts. The deselected source lines, including source line S1, are connected to voltage $V_B$ which, as also previously noted, is set to +3 volts, a voltage selected to be greater than the threshold voltage of the X Decoder Stage 72 P channel transistor 86 (FIG. 13) and lower than voltage $V_A$. Again, voltage $V_{NISO}$ is set to 0 volts thereby turning off transistor 86 of the X Decoder Stages 72 and isolating the N channel transistors 88 from the negative voltage applied to the word lines WL0–WL63 of Erase Block 0. Although not set forth in Table 6, the bit lines common to all of the erase blocks are left floating. This combination of conditions will cause the cells of Erase Block 0 to be erased.

As indicated by Table 6, in erase operations, the deselected source lines can also be left floating. This approach is preferred since, as previously noted, a defect is a deselected erase block will not adversely affect the operation of the selected erase block.

Thus, a novel flash cell array arrangement divided into array segments having separate source lines has been disclosed. Although a various embodiments of the subject invention have been described in some detail, it is to be understood that certain changes can be made by those skilled in the art without departing from the spirit and scope of the invention as defined by the appended claims.

I claim:

1. An arrangement of non-volatile memory cells, with each of the cells including a source region, a drain region and a control gate, said arrangement comprising:

a plurality of erase blocks, with each of the erase blocks including an array of the cells arranged in a plurality of rows and columns;

a source line structure associated with each of the erase blocks, with the source line structure including a first group of source lines positioned to electrically interconnect the sources of cells located in at least one of the rows of the associated erase block and a second group of source lines positioned to electrically interconnect the sources of cells located in at least one of the columns of the associated erase block; and an erase source decoder configured to selectively permit erasure of a selected one of the erase blocks, with the erase source decoder being coupled to the second erase block by the second group of source lines associated with the second erase block which extend from the second erase block and over the first erase block to the erase source decoder and being coupled to the first erase block by the second group of source lines associated with the first erase block which extend from the first erase block to the erase source decoder.

2. The arrangement of claim 1 wherein the first group of source lines are non-metallic source lines and the second group of source lines are metallic source lines.

3. The arrangement of claim 2 wherein the second group of source lines associated with the second erase block includes a plurality of source lines, each of which are disposed between separate columns of the first erase block.

4. The arrangement of claim 2 further comprising a third one of the erase blocks and an associated source line structure, with the third erase block being coupled to the erase source decoder by the second group of the source lines of the source line structure associated with the third erase block which extend over the first and second erase blocks to the erase source decoder.

5. An arrangement of non-volatile memory cells, with each of the cells including a source region, a drain region and a control gate, said arrangement comprising:

first, second, third and fourth erase blocks, with each of the erase blocks including an array of the cells arranged in a plurality of rows and columns;

a source line structure associated with each of the erase blocks, with the source line structure including a first group of source lines positioned to electrically interconnect the sources of cells located in at least one of the rows of the associated erase block and a second group of source lines positioned to electrically interconnect the sources of cells located in at least one of the columns of the associated erase block; and an erase source decoder configured to selectively permit erasure of a selected one of the erase blocks, with the erase source decoder being coupled to the first erase block by the second group of source lines associated with the first erase block which extend from the first erase block to the erase source decoder, being coupled to the second erase block by the second group of source lines associated with the second erase block which extend from the second erase block, over the first erase block, to the erase source decoder, being coupled to the third erase block by the second group of source lines associated with the third erase block which extend from the third erase block over the first and second erase blocks to the erase source decoder and being coupled to the fourth erase block by the second group of source lines associated with the fourth erase block which extend from the fourth erase block over the third, second and first erase blocks to the erase source decoder.

6. The arrangement of claim 5 wherein the second group of source lines associated with the second erase block includes a plurality of source lines, each of which extends between separate columns of the first erase block and wherein the second group of source lines associated with the third erase block includes a plurality of source lines, each of which extends between separate columns of the first and second erase blocks and wherein the second group of source lines associated with the fourth erase block includes a plurality of source lines, each of which extends between separate columns of the first, second and third erase blocks.

7. The arrangement of claim 6 wherein the first group of source lines are non-metallic source lines and the second group of source lines are metallic source lines.

8. The arrangement of claim 6 wherein the first group of source lines have an electrical conductivity which is less than an electrical conductivity of the second group of source lines.

9. An arrangement of non-volatile memory cells each having a source region, a drain region and a control gate, said arrangement comprising:

first and second erase blocks, with each of the erase blocks including memory cells arranged in an array comprising a plurality of rows and a plurality of columns, with each cell in one of the rows having their control gates connected to a common word line and with each cell in one of the columns having their drain regions connected to a common bit line and with each of the source regions being connected to a common source line structure, with the cell columns of the erase blocks being generally aligned with one another and with each erase block including first and second opposite block edges extending generally parallel with the cell rows and with the source line structure of each erase block including a plurality of source lines of a first conductivity positioned to interconnect at least some of the source regions of cells located in one of the rows, and at least two source lines of a second conductivity, greater than the first conductivity, positioned to interconnect the source regions of cells located in one of the columns, with the at least two source lines of the second conductivity being spaced apart from one other by a plurality of the cell columns, with the erase blocks being positioned relative to one another so that the first block edge of the first erase block is facing the first block edge of the second erase block, with the second conductivity source lines of the first erase block extending over the second edge of the first erase block and not extending over the second edge of the second erase block and with the source lines of the second conductivity of the second erase block extending over the second edge of the second erase block and not extending over the second edge of the first erase block.

10. The arrangement of claim 9 further including third and fourth ones of the erase blocks, with the first edge of the third erase block facing the second edge of the first erase block and with the first edge of the fourth erase block facing the second edge of the second erase block and with the source lines of the second conductivity of the first erase block further extending over the first and second edges of the third erase block, with the source lines of second conductivity of the second erase block further extending over the first and second edges of the fourth erase block and with the source lines of the second conductivity of the third erase block extending over the second edge of the third erase block and with the source lines of the second conductivity of the fourth erase block extending over the second edge of the fourth erase block.

11. An arrangement of non-volatile memory cells, each cell including a drain region, a source region and a control gate, said arrangement comprising:

a plurality of erase blocks, with each of the erase blocks including memory cells arranged in an array comprising a plurality of rows and a plurality of columns, with each cell in one of the rows having their control gates connected to a common word line and with each cell in one of the columns having their drain regions connected to a common bit line and with each of the source regions being connected to a common source line structure, with each erase block including first and second opposite block edges extending generally parallel with the cell rows and with the source line structure of each erase block including a source line of a first conductivity positioned to interconnect the source regions of cells located in one of the rows, and a source line of a second conductivity positioned to interconnect the source lines of the first conductivity, with first and second ones of the erase blocks being positioned relative to one another so that the first block edge of the first erase block is facing the second block edge of the second erase block and with the source line of the second conductivity of the first erase block extending across the first edge of the first erase block, extending across the second edge of the second erase block, extending across the second erase block and extending across the first edge of the second erase block.

12. The arrangement of claim 11 wherein the first conductivity is less than the second conductivity.

13. The arrangement of claim 11 wherein the first conductivity source line is a non-metallic source line and the second conductivity source line is a metallic source line.

14. The arrangement of claim 11 wherein the source line of the second conductivity of the second erase block extends across the first block edge of the second erase block.

15. The arrangement of claim 14 wherein the source line structure of each of the erase blocks includes a plurality of the source lines of the second conductivity spaced apart on the erase block and separated by a plurality of the cell columns and wherein the plurality of source lines of the second conductivity of the first erase block extend across the first block edge of the first erase block, across the second block edge of the second erase block, across the second erase block and across the first edge of the second erase block.

16. The arrangement of claim 15 wherein the erase blocks further include third and fourth erase blocks, with the third erase block being positioned intermediate the first and fourth erase blocks such that the second block edge of the third erase block faces the second block edge of the first erase block and the first block edge of the third block faces the second block edge of the fourth erase block and with the source lines of the second conductivity of the third erase block extending across the first block edge of the third erase block, and extending across the second edge of the fourth erase block, extending across the fourth erase block and extending across the first edge of the fourth erase block.

17. An arrangement of non-volatile memory cells, with each of the cells including a source region, a drain region and a control gate, said arrangement comprising:

first, second, third and fourth erase blocks, with each of the erase blocks including memory cells arranged in an array comprising a plurality of rows and a plurality of columns, with each cell in one of the rows having their control gates connected to a common word line and with each cell in one of the columns having their drain regions connected to a common bit line and with each of the source regions being connected to a common source line structure, with the cell columns of the erase blocks being generally aligned with one another and with each erase block including first and second opposite block edges extending generally parallel with the cell rows and with the source line structure of each erase block including a plurality of source lines of a first conductivity positioned to interconnect at least some of the source regions of cells located in one of the rows, at least two source lines of a second conductivity, greater than the first conductivity, positioned to interconnect the source regions of cells located in one of the columns, with the at least two source lines of the second conductivity being spaced apart from one other by a plurality of the cell columns, and at least two source straps of the second conductivity positioned to interconnect the source regions of cells located in one of the columns, with the source straps being spaced apart from one another by a plurality of the cell columns, and with the source straps being completely disposed between the first and second block edges of the erase block, with the erase blocks being positioned relative to one another so that the first block edge of the first erase block is facing the second block edge of the second erase block, the first block edge of the second erase block is facing the second block edge of the third erase block and the first block edge of the third erase block is facing the second block edge of the fourth erase block and with the source lines of the second conductivity of the first erase block extending across the first edge of the first erase block, across the first and second edges of the second, third and fourth erase blocks, the source lines of the second conductivity of the second erase block extending across the first edge of the second erase block, across the first and second edges of the third and fourth erase blocks, the source lines of the second conductivity of the third erase block extending across the first edge of the third erase block and across the first and second edges of the fourth erase block and the source lines of the second conductivity of the fourth erase block extending across the first edge of the fourth erase block.

18. The arrangement of claim 17 wherein the source lines of the second conductivity of the fourth erase block are disposed adjacent a first and second ones of the fourth erase block cell columns and wherein the source straps of the second conductivity of the first, second and third erase blocks are disposed adjacent the first and second cell columns of the respective first, second and third erase blocks which are generally aligned with the respective first and second cell columns of the fourth erase block.

19. The arrangement of claim 18 wherein the source lines of the second conductivity of the third erase block are disposed adjacent a third and fourth ones of the third erase block cell columns and wherein the source straps of the second conductivity of the first and second erase blocks are disposed adjacent the third and fourth cell columns of the respective first and second erase blocks which are generally aligned with the respective third and fourth cell columns of the third erase block.

20. The arrangement of claim 19 wherein the source lines of the second conductivity of the second erase block are disposed adjacent a fifth and sixth ones of the second erase block cell columns and wherein the metal source straps of the first erase block are disposed adjacent the fifth and sixth cell columns of the first erase block which are generally aligned with the respective fifth and sixth cell columns of the second erase block.

21. The arrangement of claim 20 wherein the source lines of the first conductivity type of the erase block are disposed adjacent a seventh and eighth ones of the first erase block cell columns and wherein the source straps of the second conductivity of the second, third and fourth erase blocks further include source straps which are disposed adjacent the seventh and eighth cell columns of the respective second, third and fourth erase blocks which are generally aligned with the respective seventh and eighth cell columns of the first erase block.

22. The arrangement of claim 17 wherein the first conductivity is less than the second conductivity.

23. The arrangement of claim 17 wherein the first conductivity source lines are non-metallic source lines and the second conductivity source lines are metallic source lines.

24. A method of controlling erase operations on an arrangement of non-volatile memory cells, with each of the cells including a source region, a drain region and a control gate, said method comprising the following steps:

arranging the cells into first, second and third erase blocks, with the cells in each of the erase blocks being arranged into a plurality of rows and a plurality of columns;

electrically interconnecting the source regions of the cells located in each of the rows together along a path generally parallel to the rows;

electrically interconnecting the source regions of the cells located in at least two of the columns along a path generally parallel to the columns; and selectively controlling erasure of the first erase block, including the step of electrically coupling the source regions of the first erase block to a decode location along a path which extends over the second and third erase blocks to the decode location.

25. The method of claim 24 the source regions of the first erase block are electrically coupled to the decode location along two paths which are separated by a plurality of cell columns of the second erase block and a plurality of cell columns of the third erase block.

26. The method of claim 25 further comprising the step of selectively controlling erasure of the second erase block, including the step of electrically coupling the source regions of the second erase block to the decode location along a path which extends over the third erase blocks to the decode location and not over the first erase block.

27. The method of claim 26 the source regions of the second erase block are electrically coupled to the decode location along two paths which are separated by a plurality of cell columns of the third erase block.

28. The method of claim 27 further comprising the step of selectively controlling erasure of the third erase block, including the step of electrically coupling the source regions of the third erase block to the decode location along two paths which do not extend over the first and second erase blocks.

29. The method of claim 28 wherein the step of arranging the cells into first, second and third erase blocks includes the step of positioning the cell columns so that the cell columns of the erase blocks are aligned with one another.

30. The method of claim 29 wherein the step of electrically interconnecting the source regions of the cells located in at least two of the columns of the first erase block includes the step of electrically interconnecting the source regions along two additional paths which are generally aligned with two paths used to electrically couple the third erase block to the decode location, and wherein the two additional paths do not extend over the second and third erase blocks.

31. The method of claim 30 wherein the step of electrically interconnecting the source regions of the cells located in at least two of the columns of the second erase block includes the step of electrically interconnecting the source regions along two additional paths which are generally aligned with the two paths used to electrically couple the third erase block to the decode location, and wherein the two additional paths do not extend over the first and third erase blocks.

32. The method of claim 30 wherein the step of electrically interconnecting the source regions of the cells located in at least two of the columns of the first erase block includes the step of electrically interconnecting the source regions along two additional paths which are generally aligned with two paths used to electrically couple the second erase block to the decode location, and wherein the two additional paths do not extend over the second and third erase blocks.

33. A method of controlling erase operations on an arrangement of non-volatile memory cells, with each of the cells including a source region, a drain region and a control gate, said method comprising the following steps:

arranging the cells into first, second, third and fourth erase blocks, with the cells in each of the erase blocks being arranged into a plurality of rows and a plurality of columns:

electrically interconnecting the source regions of the cells located in each of the rows together along a path generally parallel to the rows;

electrically interconnecting the source regions of the cells located in at least two of the columns along a path generally parallel to the columns;

selectively controlling erasure of the second erase block, including the step of electrically coupling the source regions of the second erase block to a first decode location along a path which extends over the first erase block to the first decode location and does not extend over the third and fourth erase blocks; and selectively controlling erasure of the third erase block, including the step of electrically coupling the source regions of the third erase block to a second decode location along a path which extends over the fourth erase block to the second decode location and does not extend over the first and second erase blocks.

34. The method of claim 33 further including the step of selectively controlling erasure of the first erase block, including the step of electrically coupling the source regions of the first erase block to the first decode location along a path which does not extend over the second, third or fourth erase blocks.

35. The method of claim 34 further including the step of selectively controlling erasure of the fourth erase block, including the step of electrically coupling the source regions of the fourth erase block to the second decode location along a path which does not extend over the first, second or third erase blocks.

* * * * *

UNITED STATES PATENT AND TRADEMARK OFFICE
CERTIFICATE OF CORRECTION

PATENT NO. : 5,793,087
DATED : August 11, 1998
INVENTOR(S) : Christophe J. Chevallier It is certified that error appears in the above-identified patent and that said Letters Patent is hereby corrected as shown below:

At Col. 24, line 59, claim 25, please insert "wherein" after "claim 24".

At Col. 25, line 3, claim 27, please insert "wherein" after "claim 26".

Signed and Sealed this

Twenty-third Day of March, 1999

Attest:

Q. TODD DICKINSON

*Attesting Officer*    *Acting Commissioner of Patents and Trademarks*